United States Patent
Kim et al.

(10) Patent No.: US 11,747,924 B2
(45) Date of Patent: Sep. 5, 2023

(54) DISPLAY DEVICE AND METHOD OF MANUFACTURING THE SAME

(71) Applicant: Samsung Display Co., LTD., Yongin-si (KR)

(72) Inventors: Jungi Kim, Seoul (KR); Jaehun Lee, Seongnam-si (KR); Bogeon Jeon, Hwaseong-si (KR); Yang-Ho Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 55 days.

(21) Appl. No.: 16/951,441

(22) Filed: Nov. 18, 2020

(65) Prior Publication Data

US 2021/0181879 A1 Jun. 17, 2021

(30) Foreign Application Priority Data

Dec. 17, 2019 (KR) ........................ 10-2019-0168981

(51) Int. Cl.
| | |
|---|---|
| *G06F 3/041* | (2006.01) |
| *H10K 50/858* | (2023.01) |
| *H10K 59/40* | (2023.01) |
| *H10K 59/12* | (2023.01) |

(52) U.S. Cl.
CPC ......... *G06F 3/0412* (2013.01); *H10K 50/858* (2023.02); *H10K 59/40* (2023.02); *G06F 2203/04103* (2013.01); *H10K 59/12* (2023.02)

(58) Field of Classification Search
CPC ....... G06F 3/0412; G06F 3/0446; G06F 3/044
See application file for complete search history.

(56) References Cited

U.S. PATENT DOCUMENTS

| | | | | |
|---|---|---|---|---|
| 8,357,555 | B2 * | 1/2013 | Tsuji | H01S 5/1231 257/E33.068 |
| 8,486,809 | B2 * | 7/2013 | Tsuji | H01S 5/1231 438/32 |
| 8,709,703 | B2 * | 4/2014 | Deng | G02B 5/1857 430/321 |
| 9,112,183 | B2 * | 8/2015 | Ohta | H01L 51/5275 |
| 9,368,759 | B2 * | 6/2016 | Kim | H01L 27/323 |
| 10,126,473 | B2 * | 11/2018 | Tanimoto | G02F 1/13363 |

(Continued)

FOREIGN PATENT DOCUMENTS

| | | |
|---|---|---|
| KR | 10-1596983 | 2/2016 |
| KR | 10-2017-0113822 | 10/2017 |

(Continued)

*Primary Examiner* — Olga V Merkoulova
(74) *Attorney, Agent, or Firm* — H.C. Park & Associates, PLC

(57) ABSTRACT

A display device includes a display panel with a light emitting area from which a light exits and an input sensor disposed on the display panel. The input sensor includes a first conductive layer, a first insulating layer disposed on the first conductive layer and provided with a diffraction grating defined therein to correspond to the light emitting area, and a second conductive layer disposed on the first insulating layer and connected to the first conductive layer. The first insulating layer includes an organic layer covering the first conductive layer and an inorganic layer disposed on the organic layer. The organic layer and the inorganic layer include a plurality of holes defined therein to define the diffraction grating.

24 Claims, 20 Drawing Sheets

(56) References Cited

U.S. PATENT DOCUMENTS

| | | | |
|---|---|---|---|
| 10,347,700 B2 | 7/2019 | Yang et al. | |
| 10,539,734 B2* | 1/2020 | Shim | G02B 6/0038 |
| 10,644,083 B2* | 5/2020 | Lee | G06F 3/0446 |
| 10,727,444 B2* | 7/2020 | Byun | H01L 51/5275 |
| 10,903,284 B2* | 1/2021 | Lee | G06F 3/0443 |
| 10,998,521 B2* | 5/2021 | Park | H01L 51/56 |
| 2011/0306185 A1* | 12/2011 | Tsuji | B82Y 20/00 |
| | | | 257/E21.09 |
| 2014/0227488 A1* | 8/2014 | Brehm | B42D 25/45 |
| | | | 428/199 |
| 2014/0306213 A1* | 10/2014 | Sato | H10K 50/11 |
| | | | 257/40 |
| 2017/0250376 A1* | 8/2017 | Sasaki | H10K 50/852 |
| 2018/0024287 A1* | 1/2018 | Shim | G02B 6/0038 |
| | | | 362/611 |
| 2018/0350883 A1* | 12/2018 | Lee | G06F 3/044 |
| 2019/0051711 A1* | 2/2019 | Lee | H01L 27/323 |
| 2019/0097171 A1* | 3/2019 | Park | H01L 51/5253 |
| 2020/0067020 A1 | 2/2020 | Byun et al. | |

FOREIGN PATENT DOCUMENTS

| | | |
|---|---|---|
| KR | 10-2017-0121674 | 11/2017 |
| KR | 10-2019-0016635 | 2/2019 |
| KR | 10-2020-0071189 | 6/2020 |

\* cited by examiner

DISPLAY DEVICE AND METHOD OF MANUFACTURING THE SAME

CROSS-REFERENCE TO RELATED APPLICATION

This application claims priority from and the benefit of Korean Patent Application No. 10-2019-0168981, filed on Dec. 17, 2019, which is hereby incorporated by reference for all purposes as if fully set forth herein.

BACKGROUND

Field

Embodiments of the invention relate generally to a display device and a method of manufacturing the same and more specifically, to a display device having improved viewing angle characteristics and a method of manufacturing the display device.

Discussion of the Background

A display device is classified into a self-light-emitting type display device that emits light using a light emitting element thereof to display an image and a light-receiving type display device that controls a transmittance of light provided thereto to display the image. The self-light-emitting type display device is, for example, an organic light emitting display device. The light generated by a light emitting layer of the organic light emitting display device travels in a lateral direction as well as a front direction.

The organic light emitting display device includes an organic light emitting diode that generates the light. However, a light emission property of the organic light emitting diode is lowered in a lateral side as compared with a light emission property in a front side thereof, and this leads to a phenomenon in which brightness of a side viewing angle of the organic light emitting display device is lower than a brightness of a front viewing angle thereof.

The above information disclosed in this Background section is only for understanding of the background of the inventive concepts, and, therefore, it may contain information that does not constitute prior art.

SUMMARY

Additional features of the inventive concepts will be set forth in the description which follows, and in part will be apparent from the description, or may be learned by practice of the inventive concepts.

One or more embodiments of the present disclosure provides a display device having improved viewing angle characteristics and improved display quality.

One or more embodiments of the present disclosure provides a method of manufacturing the display device.

According to one or more embodiments of the invention, a display device includes a display panel with a light emitting area from which a light exits and an input sensor disposed on the display panel. The input sensor includes a first conductive layer, a first insulating layer disposed on the first conductive layer and provided with a diffraction grating defined therein to correspond to the light emitting area, and a second conductive layer disposed on the first insulating layer and connected to the first conductive layer. The first insulating layer includes an organic layer covering the first conductive layer and an inorganic layer disposed on the organic layer. The organic layer and the inorganic layer include a plurality of holes defined therein to define the diffraction grating.

According to one or more embodiments, each of the holes may include a first hole penetrating through the inorganic layer and a second hole penetrating through the organic layer, and the first hole and the second hole may be aligned with each other.

According to one or more embodiments, each of the holes may have a depth that is substantially the same as a thickness of the first insulating layer.

According to one or more embodiments, the second conductive layer may include a sensing pattern through which an opening is defined, and the opening overlaps the diffraction grating when viewed in a plane.

According to one or more embodiments, the input sensor may further include a second insulating layer that covers the second conductive layer, and the second insulating layer is filled in the holes.

According to one or more embodiments, the second insulating layer may have a refractive index different from a refractive index of the first insulating layer.

According to one or more embodiments, the second insulating layer may be provided with an opening defined therethrough to expose the diffraction grating, and the input sensor may further include a third insulating layer that covers the first and second insulating layers and is filled in the holes.

According to one or more embodiments, a refractive index of the first insulating layer, a refractive index of the second insulating layer, and a refractive index of the third insulating layer may be different from each other.

According to one or more embodiments, the input sensor may further include a base insulating layer, and the first conductive layer makes contact with the base insulating layer.

According to one or more embodiments, the base insulating layer may be an organic layer.

According to one or more embodiments, the display panel may include a base layer, a circuit element layer disposed on the base layer, a display element layer disposed on the circuit element layer, and an encapsulation layer disposed on the display element layer, and the base insulating layer is disposed directly on the encapsulation layer.

According to one or more embodiments, the holes may be arranged at regular intervals, and at least one of the holes may extend to a portion of the base insulating layer after penetrating through the inorganic layer and the organic layer.

According to one or more embodiments, the inorganic layer may have a thickness smaller than a thickness of the organic layer.

According to one or more embodiments, the organic layer may be provided with a first through hole defined therethrough to expose a portion of the first conductive layer, and the inorganic layer extending to the first through hole to cover a portion of the first conductive layer may be provided with a second through hole to expose another portion of the first conductive layer.

According to one or more embodiments, the inorganic layer may have a refractive index different from a refractive index of the organic layer.

According to one or more embodiments, the refractive index of the organic layer may be equal to or greater than about 0.7 and equal to or smaller than about 3, and the refractive index of the inorganic layer may be equal to or greater than about 0.3 and equal to or smaller than about 1.

According to one or more embodiments, the organic layer may include a non-photosensitive material.

According to one or more embodiments of the invention, a method of manufacturing a display device includes forming a display panel in which a light emitting area emitting a light is defined and forming an input sensor disposed on the display panel. The forming of the input sensor includes forming a first conductive layer, forming a first insulating layer including an organic layer covering the first conductive layer and an inorganic layer disposed on the organic layer, forming a second conductive layer disposed on the first insulating layer and connected to the first conductive layer through a contact hole, forming a plurality of holes defining a diffraction grating in the first insulating layer, and forming a second insulating layer covering the second conductive layer and the first insulating layer.

According to one or more embodiments, the forming of the first insulating layer includes forming the organic layer through which a first through hole is defined to expose a portion of the first conductive layer, forming the inorganic layer on the organic layer to cover an inner wall of the first through hole, forming a photoresist layer on the inorganic layer, forming a first photoresist pattern layer including a base portion through which an opening is defined and a protrusion portion protruded from the base portion from the photoresist layer using a mask, forming a second through hole penetrating through the inorganic layer, and forming a second photoresist pattern layer including patterns corresponding to the protrusion portion from the first photoresist pattern layer.

According to one or more embodiments, the forming of the first insulating layer may include forming the organic layer to cover the first conductive layer, forming the inorganic layer on the organic layer, forming a photoresist layer on the inorganic layer, forming a first photoresist pattern layer including a base portion through which an opening is defined and a protrusion portion protruded from the base portion from the photoresist layer using a mask, forming a contact hole penetrating through the inorganic layer and the organic layer to expose a portion of the first conductive layer, and forming a second photoresist pattern layer including patterns corresponding to the protrusion portion from the first photoresist pattern layer.

According to one or more embodiments, the forming of the holes may include patterning the organic layer and the inorganic layer using the second photoresist pattern layer, and the patterning of the inorganic layer and the organic layer includes etching an area of the inorganic layer, which is not covered by the second photoresist pattern layer, to expose a portion of the organic layer, removing the second photoresist pattern layer, and etching the exposed portion of the organic layer.

According to one or more embodiments, the input sensor further may include a base insulating layer that is an organic layer, and the first conductive layer makes contact with the base insulating layer.

According to the above, a light directed to a front side among lights emitted from an organic light emitting display device displays front pixel images on a display surface, and a light directed to a lateral side is diffracted by the diffraction grating to display a plurality of copy pixel images on the display surface. Accordingly, even when a user looks at the display surface from the lateral side, the user may view the copy pixel images, and thus, the side viewing angle of the display device may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description explain the inventive concepts.

DETAILED DESCRIPTION

Figure 1:
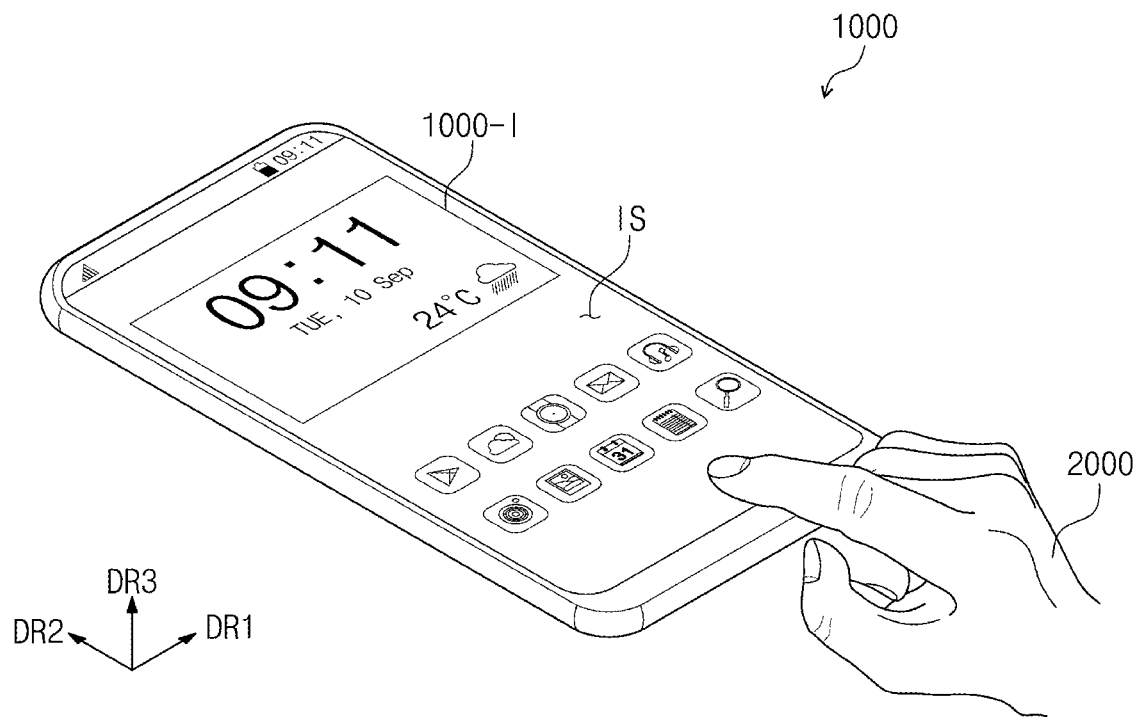
FIG. 1 is a perspective view showing a display device according to an embodiment of the inventive concepts.

In the following description, for the purposes of explanation, numerous specific details are set forth in order to provide a thorough understanding of various embodiments. It is apparent, however, that various embodiments may be practiced without these specific details or with one or more equivalent arrangements. In the accompanying figures, the size and relative sizes of layers, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view showing a display device 1000 according to an embodiment of the inventive concepts.

Figure 2:
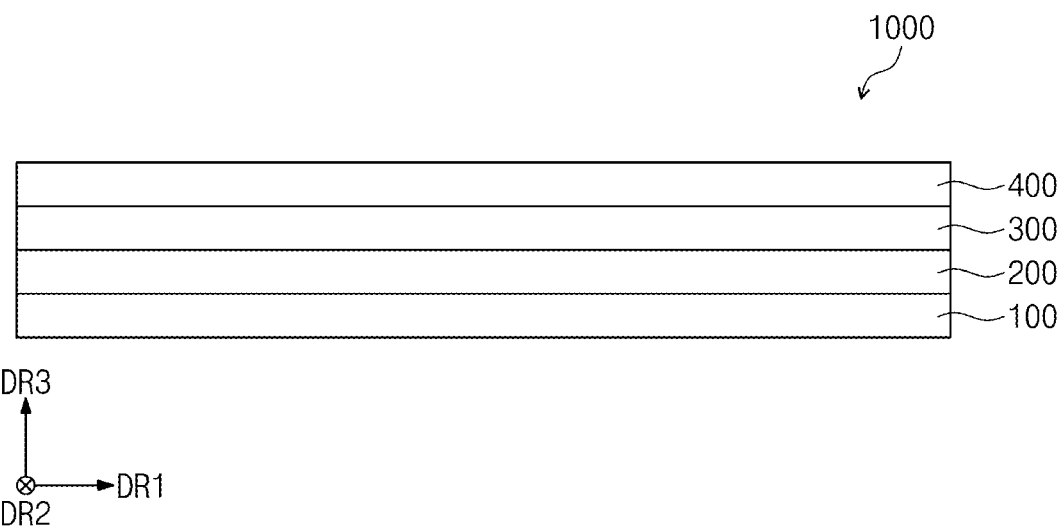
FIG. 2 is a cross-sectional view showing a display device according to an embodiment of the inventive concepts.

FIG. 2 is a cross-sectional view showing the display device 1000 according to an embodiment of the inventive concepts.

In FIG. 1, the display device 1000 may be activated in response to electrical signals. The display device 1000 may be applied to a large-sized electronic item, such as a television set and a monitor, and a small and medium-sized electronic item, such as a mobile phone, a tablet computer, a car navigation unit, a game unit, and a smart watch. In the present embodiment, a smartphone will be described as a representative example of the display device 1000.

The display device 1000 may display an image 1000-I in a third direction DR3 through a display surface IS substantially parallel to each of a first direction DR1 and a second direction DR2. The display surface IS through which the image 1000-I is displayed may correspond to a front surface of the display device 1000.

In the embodiment of the inventive concepts, front (or upper) and rear (or lower) surfaces of each member may be defined with respect to a direction in which the image 1000-I is displayed. The front and rear surfaces are opposite to each other in the third direction DR3, and a normal line direction of each of the front and rear surfaces may be is substantially parallel to the third direction DR3.

In FIG. 2, the display device 1000 may include a display panel 100, an input sensor 200, an anti-reflective layer 300, and a window 400.

The display panel 100 may have a configuration that generates the image 1000-I. The display panel 100 may be a light emitting type display panel. For example, the display panel 100 may be an organic light emitting display panel or a quantum dot light emitting display panel.

The input sensor 200 may be disposed on the display panel 100. The display panel 100 and the input sensor 200 may be formed through successive processes or may be coupled to each other by an adhesive member. The adhesive member may include a conventional adhesive or pressure sensitive adhesive. For example, the adhesive member may be a transparent adhesive member, such as a pressure sensitive adhesive (PSA) film, an optically clear adhesive (OCA) film, or an optically clear resin (OCR).

The input sensor 200 may sense an external input 2000 provided from the outside. The external input 2000 may be a user input. The user input may include various forms of external inputs, such as a portion of a user's body, light, heat, pen, or pressure. In the present embodiment, the external input 2000 is shown as a hand of user, however, this is merely exemplary. As described above, the external input 2000 may be provided in various forms, and the input sensor 200 may sense the external input 2000 applied to a side or rear surface of the display device 1000 depending on a structure of the display device 1000, and it should not be limited to a particular embodiment.

The anti-reflective layer 300 may be disposed on the input sensor 200. The anti-reflective layer 300 may reduce a reflectance of an external light incident thereto from the outside. The anti-reflective layer 300 may include a retarder and a polarizer. In addition, the anti-reflective layer 300 may include color filters. The color filters may be arranged in a predetermined arrangement, and the arrangement of the color filters may be determined by taking into account emission colors of pixels. The anti-reflective layer 300 may be omitted.

The window 400 may be disposed on the anti-reflective layer 300. The window 400 may include an optically transparent insulating material. For example, the window 400 may include a glass or plastic material. The window 400 may have a single-layer or multi-layer structure. For instance, the window 400 may include a plurality of plastic films attached to each other by an adhesive or a glass substrate and a plastic film attached to the glass substrate by an adhesive.

Figure 3:
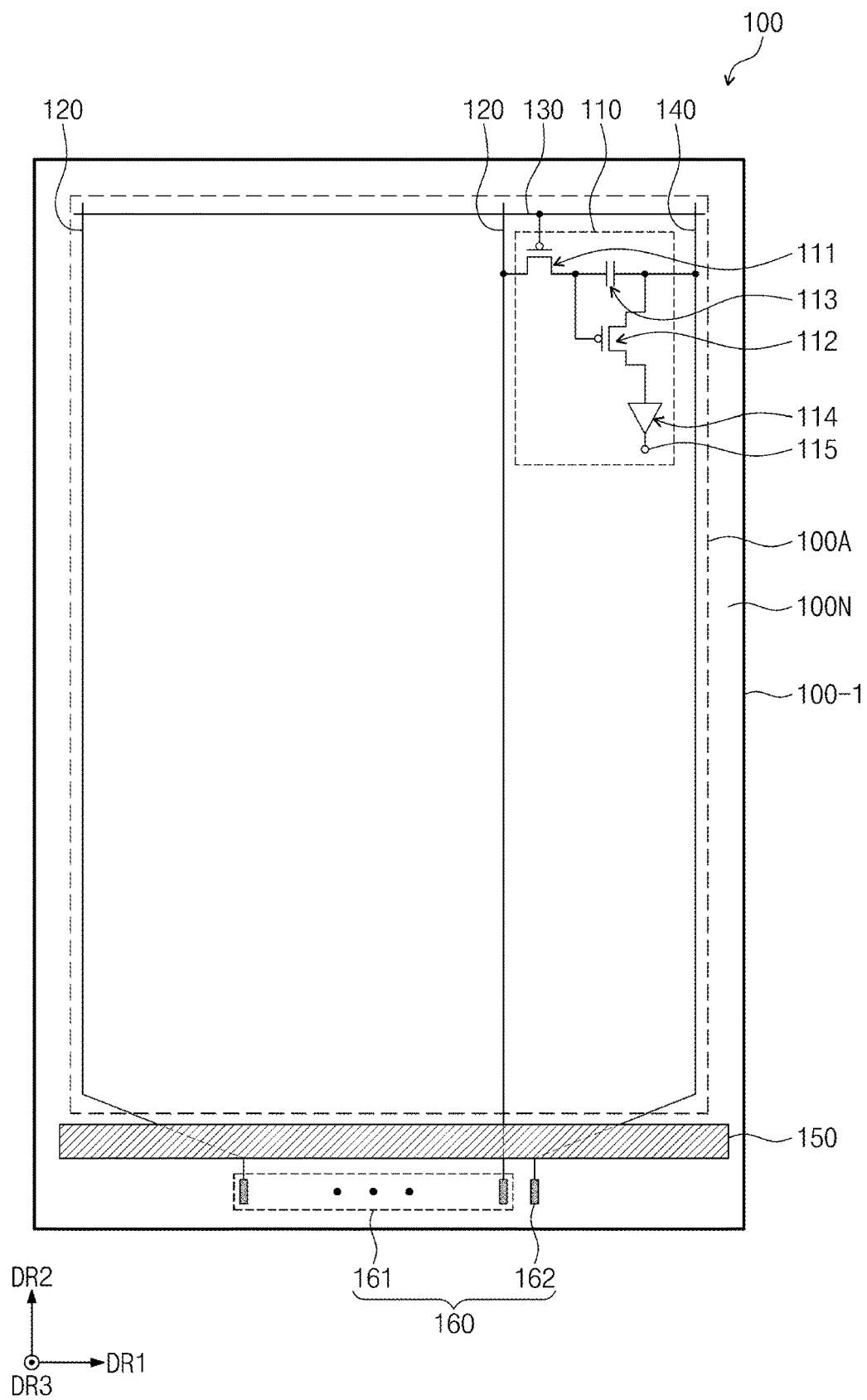
FIG. 3 is a plan view showing a display panel according to an embodiment of the inventive concepts.

FIG. 3 is a plan view showing the display panel 100 according to an embodiment of the inventive concepts.

In FIG. 3, the display panel 100 may include an active area 100A and a peripheral area 100N. The active area 100A may be activated in response to an electrical signal. For example, the active area 100A may be an area through which the image is displayed. The peripheral area 100N may surround the active area 100A. A driving circuit or a driving line, which are used to drive the active area 100A, may be disposed in the peripheral area 100N.

The display panel 100 may include a base layer 100-1, a plurality of pixels 110, a plurality of signal lines 120, 130, and 140, a power pattern 150, and a plurality of display pads 160.

The base layer 100-1 may include a synthetic resin film. The synthetic resin film may include a heat-curable resin. The base layer 100-1 may have a multi-layer structure. For instance, the base layer 100-1 may have a three-layer structure of a synthetic resin layer, an adhesive layer, and a synthetic resin layer. In particular, the synthetic resin layer may be a polyimide-based resin layer, however, the material for the synthetic resin layer should not be particularly limited. The synthetic resin layer may include at least one of an acrylic-based resin, a methacrylic-based resin, a polyisoprene, a vinyl-based resin, an epoxy-based resin, a urethane-based resin, a cellulose-based resin, a siloxane-based resin, a polyamide-based resin, and a perylene-based resin. The base layer 100-1 may include a glass substrate or an organic/inorganic composite substrate.

The signal lines 120, 130, and 140 may be connected to the pixels 110 to transmit the electrical signals to the pixels 110. FIG. 3 shows the signal lines 120, 130, and 140 including a data line 120, a scan line 130, and a power line 140 as a representative example, however, these are merely exemplary. The signal lines 120, 130, and 140 may further include at least one of an initialization voltage line and a light emitting control line, however, the signals lines 120, 130, and 140 should not be limited to a particular embodiment.

The pixels 110 may be disposed in the active area 100A. In the present embodiment, an equivalent circuit diagram of one pixel 110 among the pixels 110 is shown as a representative example. The pixel 110 may include a first transistor 111, a second transistor 112, a capacitor 113, and a light emitting device 114. The first transistor 111 may be a switching device that controls an on-/off of the pixel 110. The first transistor 111 may transmit or block a data signal applied thereto through the data line 120 in response to a scan signal applied thereto through the scan line 130.

The capacitor 113 may be connected to the first transistor 111 and the power line 140. The capacitor 113 may be charged with an electric charge by an amount corresponding to a difference between the data signal transmitted from the first transistor 111 and a first power signal applied to the power line 140.

The second transistor 112 may be connected to the first transistor 111, the capacitor 113, and the light emitting device 114. The second transistor 112 may control a driving current flowing through the light emitting device 114 in response to the amount of the electric charge charged in the capacitor 113. A turn-on time of the second transistor 112 may be determined in accordance with the amount of the electric charge charged in the capacitor 113. The second transistor 112 may provide the first power signal applied thereto through the power line 140 to the light emitting device 114 during its turn-on time.

The light emitting device 114 may generate a light or may control an amount of the light in response to electrical signals. For example, the light emitting device 114 may include an organic light emitting device or a quantum dot light emitting device.

The light emitting device 114 may be connected to a power terminal 115 and may receive a power signal (hereinafter, referred to as a "second power signal") different from the first power signal provided through the power line 140. The driving current corresponding to a difference between the first power signal provided from the second transistor 112 and the second power signal flows through the light emitting device 114, and the light emitting device 114 may generate the light corresponding to the driving current. Meanwhile, this is merely exemplary, and the pixel 110 may include electronic elements having various configurations and arrangements, and it should not be particularly limited.

The power pattern 150 may be disposed in the peripheral area 100N. The power pattern 150 may be electrically connected to a plurality of the power lines 140. As the display panel 100 includes the power pattern 150, the first power signal having substantially the same level may be provided to the pixels 110.

The display pads 160 may include a first pad 161 and a second pad 162. The first pad 161 may be provided in plural, and the first pads 161 may be respectively connected to data lines 120. The second pad 162 may be connected to the power pattern 150 to be electrically connected to the power line 140. The display panel 100 may provide the electrical signals applied thereto from the outside to the pixels 110 through the display pads 160. Meanwhile, the display pads 160 may further include pads to receive other electrical signals in addition to the first pad 161 and the second pad 162, however, the display pads 160 should not be limited thereto or thereby.

Figure 4:
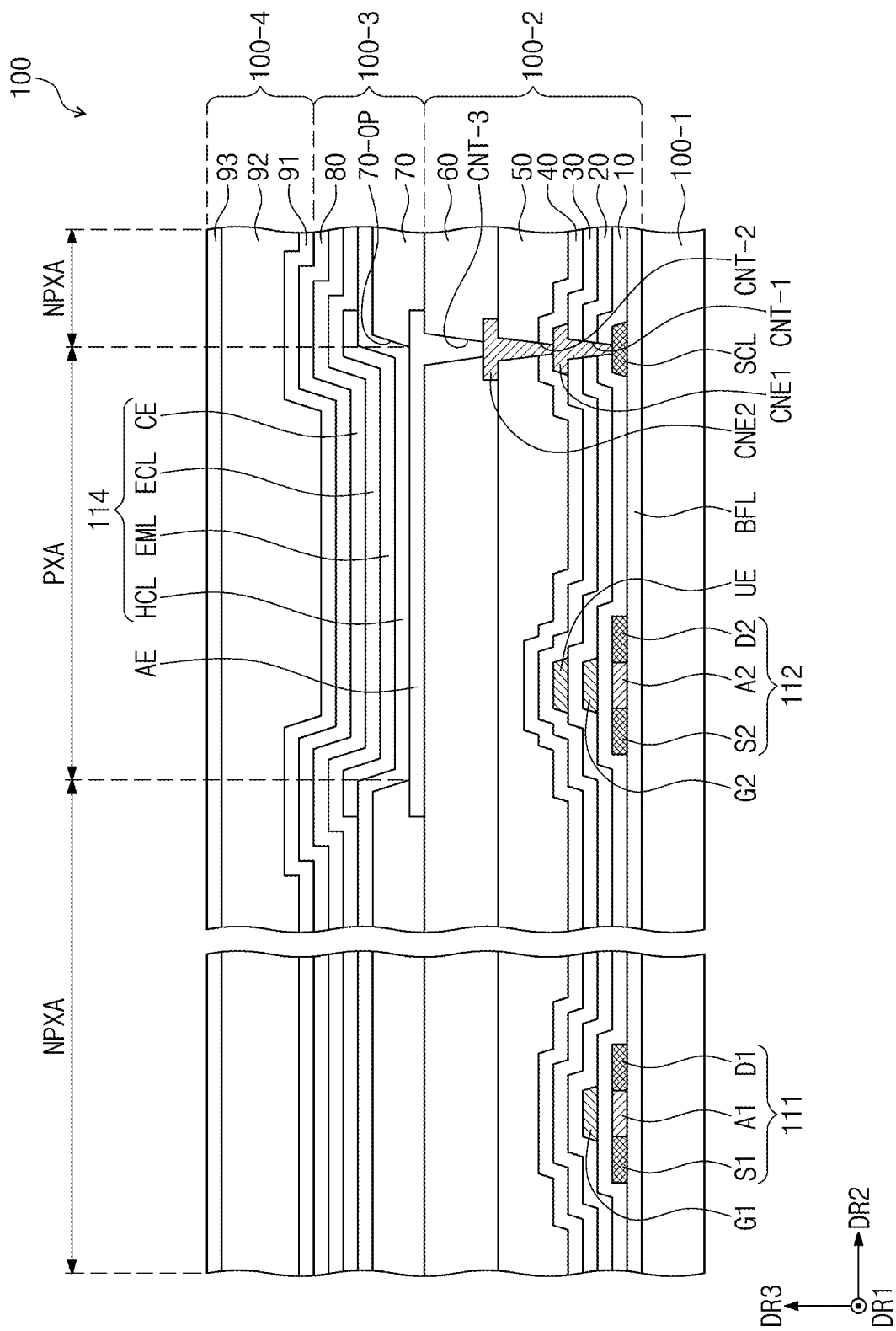
FIG. 4 is a cross-sectional view showing a display panel according to an embodiment of the inventive concepts.

FIG. 4 is a cross-sectional view showing the display panel according to an embodiment of the present disclosure.

Referring to FIG. 4, the display panel 100 may include a plurality of insulating layers, a semiconductor pattern, a conductive pattern, and a signal line. An insulating layer, a semiconductor layer, and a conductive layer may be formed by a coating or depositing process. Then, the insulating layer, the semiconductor layer, and the conductive layer may be selectively patterned by a photolithography process. In this way, the semiconductor pattern, the conductive pattern, and the signal line included in a circuit element layer 100-2 and a display element layer 100-3 may be formed. Then, an encapsulation layer 100-4 that covers the display element layer 100-3 may be formed.

At least one inorganic layer may be formed on an upper surface of the base layer 100-1. The inorganic layer may include at least one of aluminum oxide, titanium oxide, silicon oxide, silicon oxynitride, zirconium oxide, and hafnium oxide. The inorganic layer may be formed in multiple layers. The inorganic layers may form a barrier layer and/or a buffer layer. In the present embodiment, the display panel 100 may include a buffer layer BFL.

The buffer layer BFL may increase a coupling force between the base layer 100-1 and the semiconductor pattern. The buffer layer BFL may include a silicon oxide layer and a silicon nitride layer, and the silicon oxide layer and the silicon nitride layer may be alternately stacked with each other.

The semiconductor pattern may be disposed on the buffer layer BFL. The semiconductor pattern may include polysilicon, however, it should not be limited thereto or thereby. The semiconductor pattern may include amorphous silicon or metal oxide.

FIG. 4 shows only a portion of the semiconductor pattern, and the semiconductor pattern may be further disposed in other areas. The semiconductor pattern may be arranged with a specific rule over the pixels 110 (refer to FIG. 3). The semiconductor pattern may have different electrical properties depending on whether it is doped. The semiconductor pattern may include a doped region and a non-doped region. The doped region may be doped with an N-type dopant or a P-type dopant. A P-type transistor may include a doped region doped with the P-type dopant.

The doped region may have conductivity greater than that of the non-doped region and may substantially serve as an electrode or signal line. The non-doped region may substantially correspond to an active region (or channel) of a transistor. In other words, a portion of the semiconductor pattern may be the active of the transistor, another portion of the semiconductor pattern may be a source or a drain of the transistor, and the other portion of the semiconductor pattern may be a connection electrode or a connection signal line.

As shown in FIG. 4, a source S1, an active region A1, and a drain D1 of the first transistor 111 may be formed from the semiconductor pattern, and a source S2, an active region A2, and a drain D2 of the second transistor 112 may be formed from the semiconductor pattern. The sources S1 and S2 and the drains D1 and D2 may extend in opposite directions to each other from the active regions A1 and A2. FIG. 4 shows a portion of a connection signal line SCL formed from the semiconductor pattern. Although not shown in figures, the connection signal line SCL may be connected to the drain D2 of the second transistor 112 in a plane.

A first insulating layer 10 may be disposed on the buffer layer BFL. The first insulating layer 10 may commonly overlap the pixels 110 (refer to FIG. 3) and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon oxynitride, zirconium oxide, and hafnium oxide. In the present embodiment, the first insulating layer 10 may have a single-layer structure of a silicon oxide layer. Not only the first insulating layer 10, but also an insulating layer of the circuit element layer 100-2 described later may be an inorganic layer and/or an organic layer and may have a single-layer or multi-layer structure. The inorganic layer may include at least one of the above-mentioned materials.

Gates G1 and G2 may be disposed on the first insulating layer 10. The gate G1 may correspond to a portion of metal pattern. The gates G1 and G2 may overlap the active regions A1 and A2, respectively. The gates G1 and G2 may be used as a mask in a process of doping the semiconductor pattern.

A second insulating layer 20 may be disposed on the first insulating layer 10 and may cover the gates G1 and G2. The second insulating layer 20 may commonly overlap the pixels 110 (refer to FIG. 3). The second insulating layer 20 may be an inorganic layer and/or an organic layer and may have a single-layer or multi-layer structure. In the present embodiment, the second insulating layer 20 may have a single-layer structure of silicon oxide.

An upper electrode UE may be disposed on the second insulating layer 20. The upper electrode UE may overlap the gate G2 of the second transistor 112. The upper electrode UE may be a portion of metal pattern. A portion of the gate G2 and the upper electrode UE overlapping the portion of the gate G2 may define the capacitor 113 (refer to FIG. 3). In the embodiment of the present disclosure, the upper electrode UE may be omitted.

A third insulating layer 30 may be disposed on the second insulating layer 20 and may cover the upper electrode UE. In the present embodiment, the third insulating layer 30 may have a single-layer structure of silicon oxide. A first connection electrode CNE1 may be disposed on the third insulating layer 30. The first connection electrode CNE1 may be connected to the connection signal line SCL through a contact hole CNT-1 defined penetrating through the first, second, and third insulating layers 10, 20, and 30.

A fourth insulating layer 40 may be disposed on the third insulating layer 30. The fourth insulating layer 40 may have a single-layer structure of a silicon oxide. A fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 defined penetrating through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer. A first electrode AE may be disposed on the sixth insulating layer 60. The first electrode AE may be connected to the second connection electrode CNE2 through a contact hole CNT-3 defined penetrating through the sixth insulating layer 60. An opening 70-OP may be defined penetrating through a pixel definition layer 70. At least a portion of the first electrode AE may be exposed through the opening 70-OP of the pixel definition layer 70.

As shown in FIG. 4, the active area 100A (refer to FIG. 3) may include a light emitting area PXA and a non-light emitting area NPXA defined adjacent to the light emitting area PXA. The non-light emitting area NPXA may surround the light emitting area PXA. In the present embodiment, the light emitting area PXA may be defined to correspond to the portion of the first electrode AE exposed through the opening 70-OP.

A hole control layer HCL may be commonly disposed in the light emitting area PXA and the non-light emitting area NPXA. The hole control layer HCL may include a hole transport layer and may further include a hole injection layer. A light emitting layer EML may be disposed on the hole control layer HCL. The light emitting layer EML may be disposed in an area corresponding to the opening 70-OP. That is, the light emitting layer EML may be formed in each of the pixels 110 (refer to FIG. 3) after being divided into portions.

An electron control layer ECL may be disposed on the light emitting layer EML. The electron control layer ECL may include an electron transport layer and may further include an electron injection layer. The hole control layer HCL and the electron control layer ECL may be commonly formed in the plural pixels using an open mask. A second electrode CE may be disposed on the electron control layer ECL. The second electrode CE may have an integral shape and may be commonly disposed in the pixels 110 (refer to FIG. 3).

A capping layer 80 may be disposed on the second electrode CE and may make contact with the second electrode CE. The capping layer 80 may include an organic material. The capping layer 80 may protect the second electrode CE from the following process, for instance, a sputtering process, and may increase a light emission efficiency of the light emitting device 114. The capping layer 80 may have a refractive index greater than that of a first inorganic layer 91 described below.

The encapsulation layer 100-4 may be disposed on the display element layer 100-3. The encapsulation layer 100-4 may include the first inorganic layer 91, an organic layer 92, and a second inorganic layer 93. The first inorganic layer 91 and the second inorganic layer 93 may protect the display element layer 100-3 from moisture/oxygen, and the organic layer 92 may protect the display element layer 100-3 from a foreign substance such as dust particles. The first inorganic layer 91 and the second inorganic layer 93 may include one of a silicon nitride layer, a silicon oxynitride layer, and a silicon oxide layer. In the embodiment of the present disclosure, the first inorganic layer 91 and the second inorganic layer 93 may include a titanium oxide layer or an aluminum oxide layer. The organic layer 92 may include an acrylic-based organic layer, however, it should not be limited thereto or thereby.

In the embodiment of the present disclosure, an inorganic layer, for example, an LiF layer, may be further disposed between the capping layer 80 and the first inorganic layer 91. The LiF layer may increase the light emission efficiency of the light emitting device 114.

Figure 5:
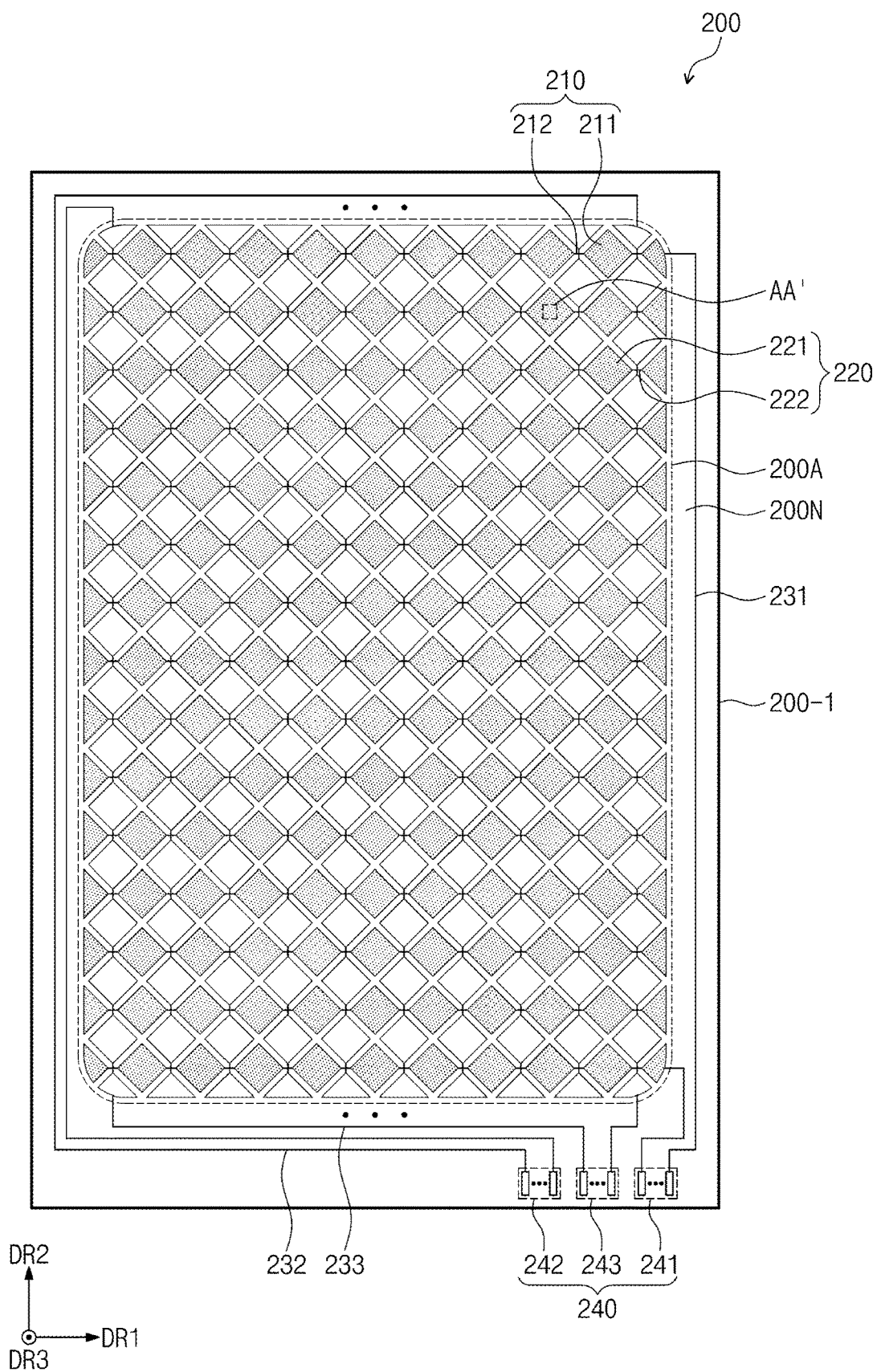
FIG. 5 is a plan view showing an input sensor according to an embodiment of the inventive concepts.

FIG. 5 is a plan view showing the input sensor 200 according to an embodiment of the present disclosure.

Referring to FIG. 5, the input sensor 200 may include an active area 200A and a peripheral area 200N. The active area 200A may be activated in response to an electrical signal. For example, the active area 200A may be an area in which an input is sensed. The peripheral area 200N may surround the active area 200A.

The input sensor 200 may include a base insulating layer 200-1, first sensing electrodes 210, second sensing electrodes 220, sensing lines 231, 232, and 233, and sensing pads 240. The first sensing electrodes 210 and the second sensing electrodes 220 may be disposed in the active area 200A, and the sensing lines 231, 232, and 233 and the sensing pads 240 may be disposed in the peripheral area 200N.

The base insulating layer 200-1 may be one of a silicon nitride layer, a silicon oxynitride layer, and a silicon oxide layer. The base insulating layer 200-1 may be formed directly on the second inorganic layer 93 (refer to FIG. 4). The base insulating layer 200-1 may be an organic layer.

The input sensor 200 may obtain information about the external input based on a variation in capacitance between the first sensing electrodes 210 and the second sensing electrodes 220.

Each of the first sensing electrodes 210 may extend in the first direction DR1, and the first sensing electrodes 210 may be arranged in the second direction DR2. The first sensing electrodes 210 may include first sensing patterns 211 and first connection patterns 212. The first connection patterns 212 may electrically connect two first sensing patterns 211 adjacent to each other.

Each of the second sensing electrodes 220 may extend in the second direction DR2, and the second sensing electrodes 220 may be arranged in the first direction DR1. The second sensing electrodes 220 may include second sensing patterns 221 and second connection patterns 222. The second connection patterns 222 may electrically connect two second sensing patterns 221 adjacent to each other.

The sensing lines 231, 232, and 233 may include first sensing lines 231, second sensing lines 232, and third sensing lines 233. The first sensing lines 231 may be electrically connected to the first sensing electrodes 210, respectively. The second sensing lines 232 may be electrically connected to one ends of the second sensing electrodes 220, respectively, and the third sensing lines 233 may be electrically connected to the other ends of the second sensing electrodes 220, respectively.

The second sensing electrodes 220 may have a relatively longer length than the first sensing electrodes 210. Accordingly, the two sensing lines 232 and 233 may be electrically connected to the second sensing electrodes 220, respectively. Therefore, a sensitivity of the second sensing electrodes 220 may be uniformly maintained. Meanwhile, this is merely exemplary, and the second sensing lines 232 or the third sensing lines 233 may be omitted.

The sensing pads 240 may include first sensing pads 241, second sensing pads 242, and third sensing pads 243. The first sensing pads 241 may be respectively connected to the first sensing lines 231. The second sensing pads 242 may be respectively connected to the second sensing lines 232. The third sensing pads 243 may be respectively connected to the third sensing lines 233.

Figure 6:
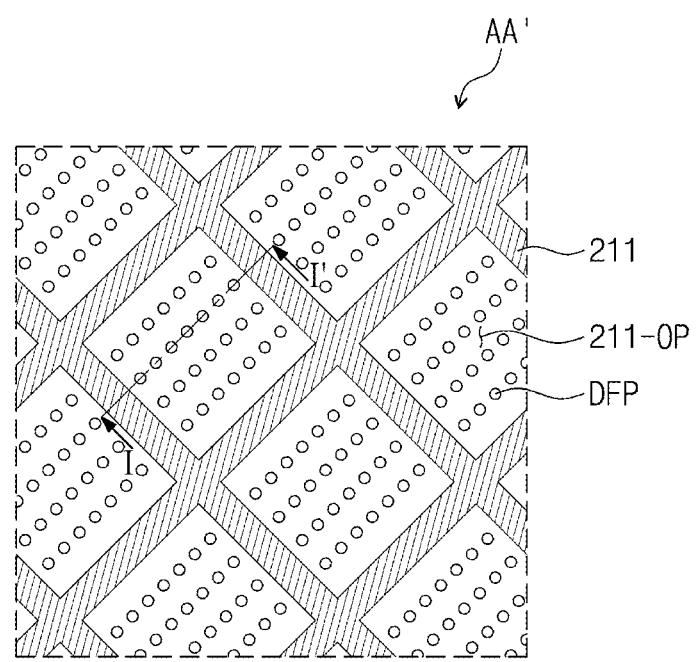
FIG. 6 is an enlarged plan view showing an area AA' of FIG. 5.
Figure 7:
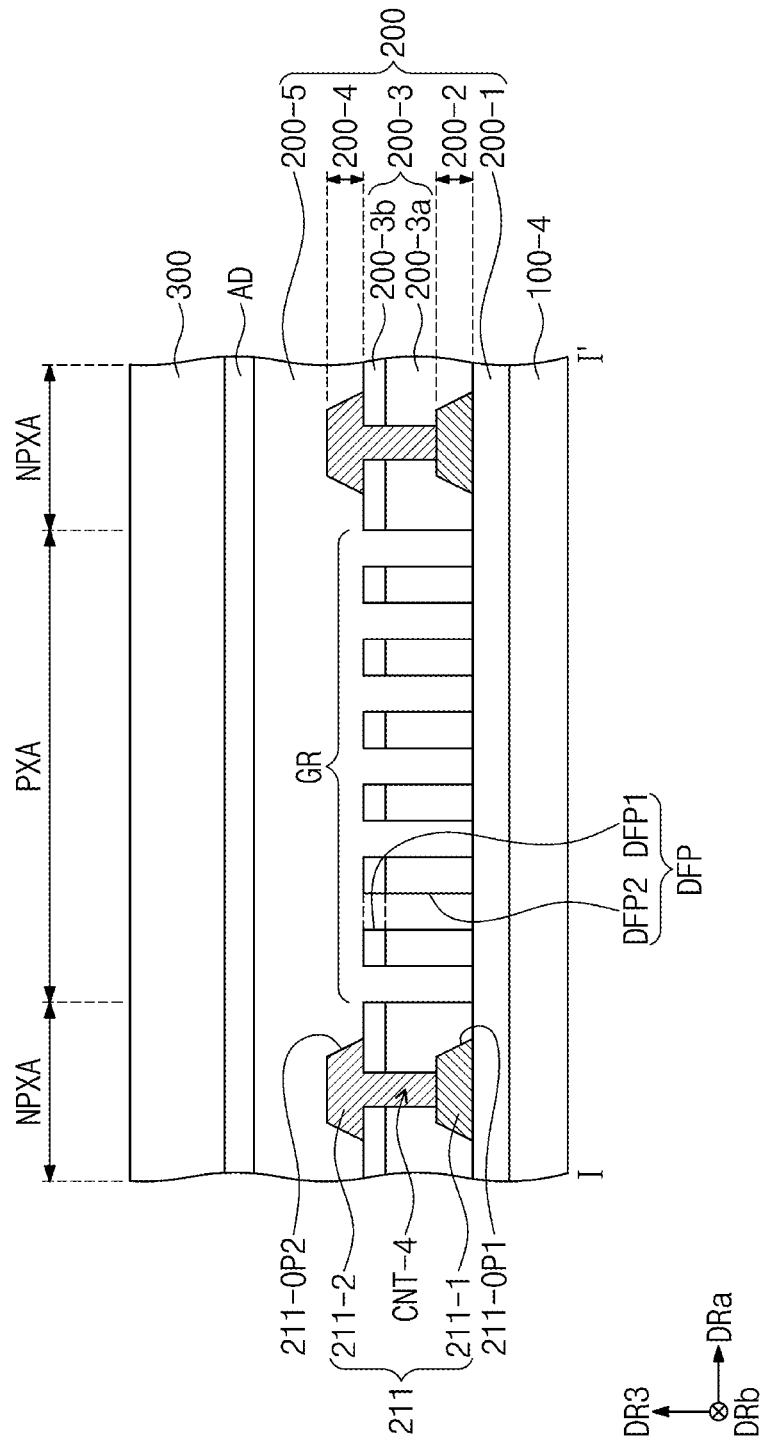
FIG. 7 is a cross-sectional view taken along a line I-I' shown in FIG. 6.

FIG. 6 is an enlarged plan view showing an area AA' of FIG. 5. FIG. 7 is a cross-sectional view taken along a line I-I' shown in FIG. 6.

FIGS. 5, 6, and 7 show an enlarged view of the first sensing pattern 211. The first sensing pattern 211 may have a mesh shape. For example, the first sensing pattern 211 may include lines extending in a fourth direction DRa and lines extending in a fifth direction DRb. A plurality of openings 211-OP may be defined in the first sensing pattern 211 by the lines.

The fourth direction DRa may be defined as a direction between the first direction DR1 and the second direction DR2, and the fifth direction DRb may be defined as a direction crossing the fourth direction DRa.

The input sensor 200 may include the base insulating layer 200-1, a first conductive layer 200-2, a first insulating layer 200-3, a second conductive layer 200-4, and a second insulating layer 200-5.

The first conductive layer 200-2 may be disposed on the base insulating layer 200-1. For example, the first conductive layer 200-2 may make contact with the base insulating layer 200-1. The first insulating layer 200-3 may be disposed on the base insulating layer 200-1 and may cover the first conductive layer 200-2. The second conductive layer 200-4 may be disposed on the first insulating layer 200-3. The second insulating layer 200-5 may be disposed on the first insulating layer 200-3 and may cover the second conductive layer 200-4. The first conductive layer 200-2 may be connected to the second conductive layer 200-4.

Each of the first conductive layer 200-2 and the second conductive layer 200-4 may include conductive patterns that form the first sensing electrodes 210 and the second sensing electrodes 220. For example, each of the first sensing patterns 211 may include a first sensing pattern layer 211-1 included in the first conductive layer 200-2 and a second sensing pattern layer 211-2 included in the second conductive layer 200-4. First openings 211-OP1 may be defined through the first sensing pattern layer 211-1, and second openings 211-OP2 may be defined through the second sensing pattern layer 211-2.

Each of the first conductive layer 200-2 and the second conductive layer 200-4 may include a metal material and/or a metal alloy and may have a single-layer or multi-layer structure. In the present embodiment, each of the first conductive layer 200-2 and the second conductive layer 200-4 may have the multi-layer structure in which titanium (Ti), aluminum (Al), and titanium (Ti) are sequentially stacked.

The first insulating layer 200-3 may include an organic layer 200-3a and may have a single-layer or multi-layer structure. According to an embodiment, the first insulating layer 200-3 may be a single organic layer. The organic layer 200-3a may include at least one of an acrylic-based resin, an epoxy-based resin, a phenolic-based resin, a polyamide-based resin, a polyimide-based resin, a methacrylic-based resin, a polyisoprene, a vinyl-based resin, a urethane-based resin, a cellulose-based resin, a siloxane-based resin, and a perylene-based resin. According to an embodiment, the organic layer 200-3a may include a photosensitive material or a non-photosensitive material. When the organic layer 200-3a includes the non-photosensitive material, the display device may be manufactured through a process different from that when the organic layer 200-3a includes the photosensitive material.

According to an embodiment, the first insulating layer may have a multi-layer structure of an organic layer and an inorganic layer. The first insulating layer 200-3 may include an inorganic layer 200-3b. The inorganic layer 200-3b may include at least one of silicon nitride, aluminum oxide, titanium oxide, silicon oxide, silicon oxynitride, zirconium oxide, and hafnium oxide, however, the inorganic layer 200-3b should not be limited. For example, the organic layer 200-3a may cover the first conductive layer 200-2, and the inorganic layer 200-3b may be disposed on the organic layer 200-3a. The inorganic layer 200-3b may have a thickness smaller than a thickness of the organic layer 200-3a and may have a refractive index different from a refractive index of the organic layer 200-3a. For example, the inorganic layer 200-3b may have the refractive index equal to or greater than about 0.3 and equal to or smaller than about 1, and the organic layer 200-3a may have the refractive index equal to or greater than about 0.7 and equal to or smaller than about 3.

A diffraction grating GR may be defined in the first insulating layer 200-3. The diffraction grating GR may be formed by a plurality of holes DFP defined therein. The diffraction grating GR may diffract at least a portion of the light incident thereto from the display panel 100. The holes DFP defining the diffraction grating GR may overlap the light emitting area PXA. According to an embodiment, although not shown in figures, a portion of the diffraction grating GR may overlap the non-light emitting area NPXA. That is, some holes of the holes DFP may overlap the non-light emitting area NPXA. According to an embodiment, the holes DFP may have a circular shape when viewed in a plane, however, the shape of the holes DFP should not be limited thereto or thereby. The holes DFP may have various shapes, such as a polygonal shape, an oval shape, or the like.

The diffraction grating GR may be defined by the holes DFP defined in the inorganic layer 200-3b and the organic layer 200-3a. According to an embodiment, the holes DFP may include a first hole DFP1 penetrating through the inorganic layer 200-3b and a second hole DFP2 penetrating through the organic layer 200-3a. The first hole DFP1 and the second hole DFP2 may be aligned with each other. A depth of the first hole DFP1 may be is substantially the same as the thickness of the inorganic layer 200-3b, and a depth of the second hole DFP2 may be substantially the same as the thickness of the organic layer 200-3a. According to an embodiment, a thickness of the first insulating layer 200-3 may be substantially the same as the depth of each of the holes DFP. Due to a process problem, the depths of the holes DFP may be different from each other and may not be completely the same as the thickness of the first insulating layer 200-3.

According to an embodiment, the second conductive layer 200-4 may include the sensing pattern through which the opening is defined. In more detail, the second conductive layer 200-4 may include the second sensing pattern layer 211-2 through which second openings 211-OP2 are defined. When viewed in the plane, the opening may overlap the diffraction grating GR. The diffraction grating GR may be disposed to overlap the second openings 211-OP2.

The second insulating layer 200-5 may cover the second conductive layer 200-4. The second insulating layer 200-5 may be filled in the holes DFP.

The second insulating layer 200-5 may have a refractive index different from a refractive index of the first insulating layer 200-3. For example, the refractive index of the second insulating layer 200-5 may be greater than the refractive index of the first insulating layer 200-3. The second insulating layer 200-5 may include an organic material having a refractive index greater than that of the first insulating layer 200-3, or the second insulating layer 200-5 may include an organic material and high-refractive-index particles mixed with the organic material. The high-refractive-index particles may include one or more of zirconium oxide ($ZrO_x$), titanium dioxide ($TiO_2$), calcium carbonate ($CaCO_3$), silicon dioxide ($SiO_2$), zinc oxide ($ZnO$), aluminum hydroxide ($Al(OH)_2$), magnesium hydroxide ($Mg(OH)_2$), and lithopone ($BaSO_2+ZnS$), however, the high-refractive-index particles should not be limited thereto or thereby.

According to an embodiment, the refractive index of the second insulating layer 200-5 may be smaller than the refractive index of the first insulating layer 200-3. The second insulating layer 200-5 may have the refractive index of about 1.6, and the first insulating layer 200-3 may have the refractive index of about 1.9. Accordingly, the light provided to the diffraction grating GR may be diffracted by a difference in refractive index between the second insulating layer 200-5 filled in the holes DFP and the first insulating layer 200-3. As a result, a color shift according to the viewing angle may be reduced. Therefore, a display quality of the display device 1000 (refer to FIG. 1) may be improved.

The color shift may be referred to as a WAD (white angular dependency). The WAD means a criterion that evaluates variation in characteristics of a white pattern depending on an angle at which the white pattern of the display device 1000 (refer to FIG. 1) is viewed, and an amount of variation in luminance and an amount of variation in color coordinates relative to a front side perpendicular to a screen are measured to evaluate a level of the variation in characteristics of the white pattern. That is, the WAD may mean a phenomenon in which a white color is changed to another color when viewing a white screen of a display at different angles. For example, a white light is visible from the front side of the display device 1000 (refer to FIG. 1), but a light having a wavelength other than the white may be viewed from a lateral side of the display device due to an optical path difference.

Figure 8:
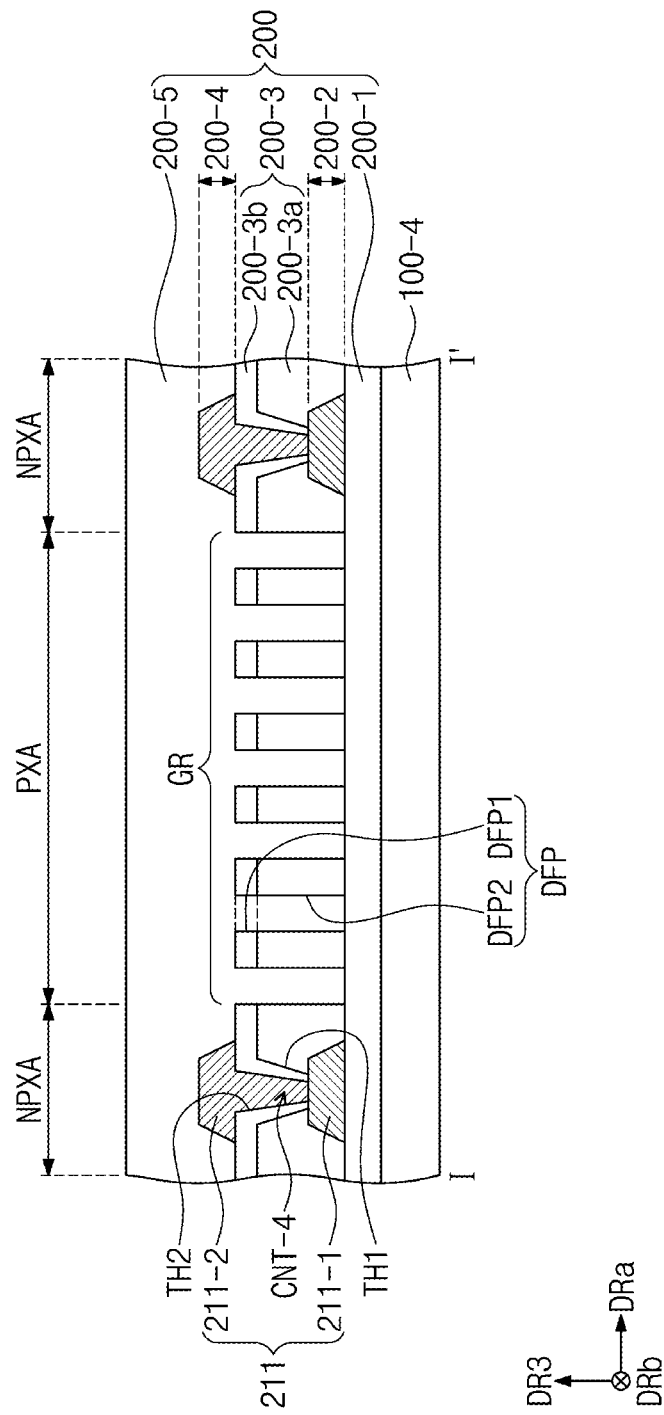
FIG. 8 is a cross-sectional view taken along a line I-I' shown in FIG. 6.

FIG. 8 is a cross-sectional view taken along a line I-I' shown in FIG. 6.

In FIG. 8, the inorganic layer 200-3b may extend to a sidewall of a contact hole CNT-4 and may cover a portion of the first conductive layer 200-2. In more detail, a first through hole TH1 may be defined penetrating through the organic layer 200-3a to expose a portion of the first conductive layer 200-2, and the inorganic layer 200-3b may extend to the first through hole TH1 to cover a portion of the first conductive layer 200-2, and a second through hole TH2 may be defined penetrating through the inorganic layer 200-3b to expose another portion of the first conductive layer 200-2. An area in which the first through hole TH1 does not overlap the second through hole TH2 may be an area in which the inorganic layer 200-3b is disposed.

Figure 9:
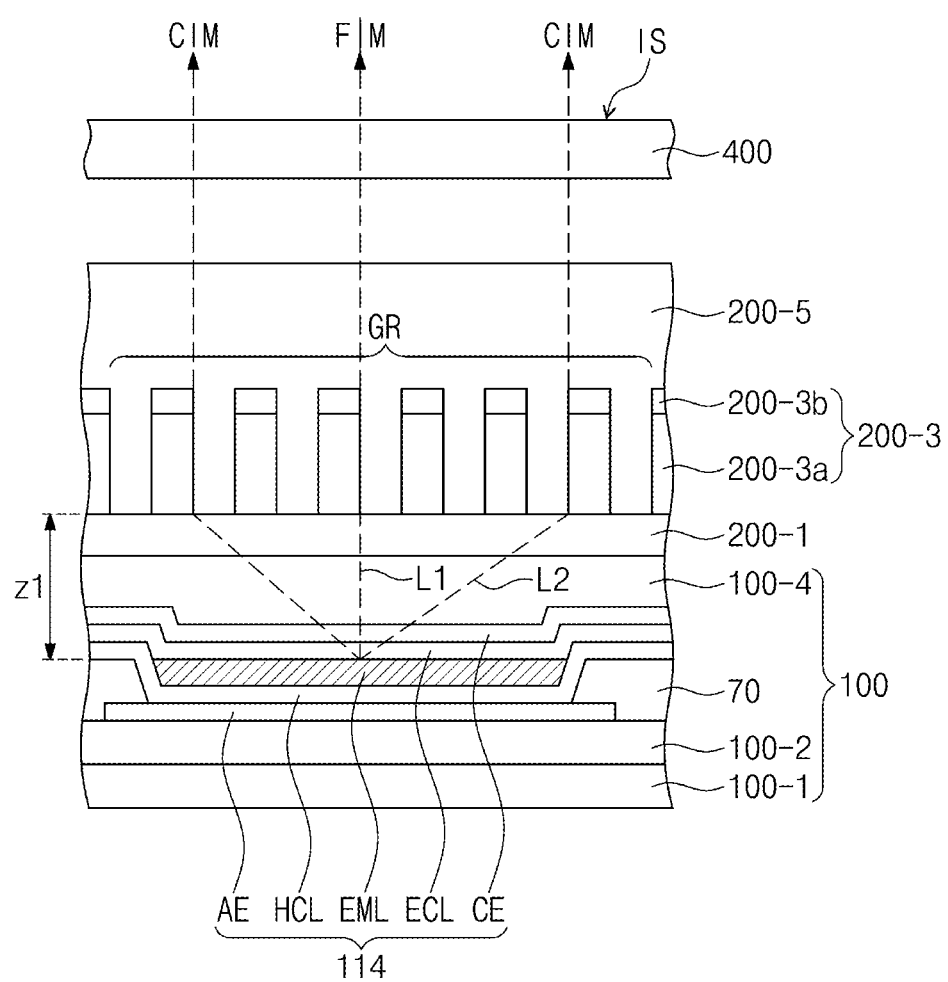
FIG. 9 is a cross-sectional view showing a display device according to an embodiment of the inventive concepts.
Figure 10:
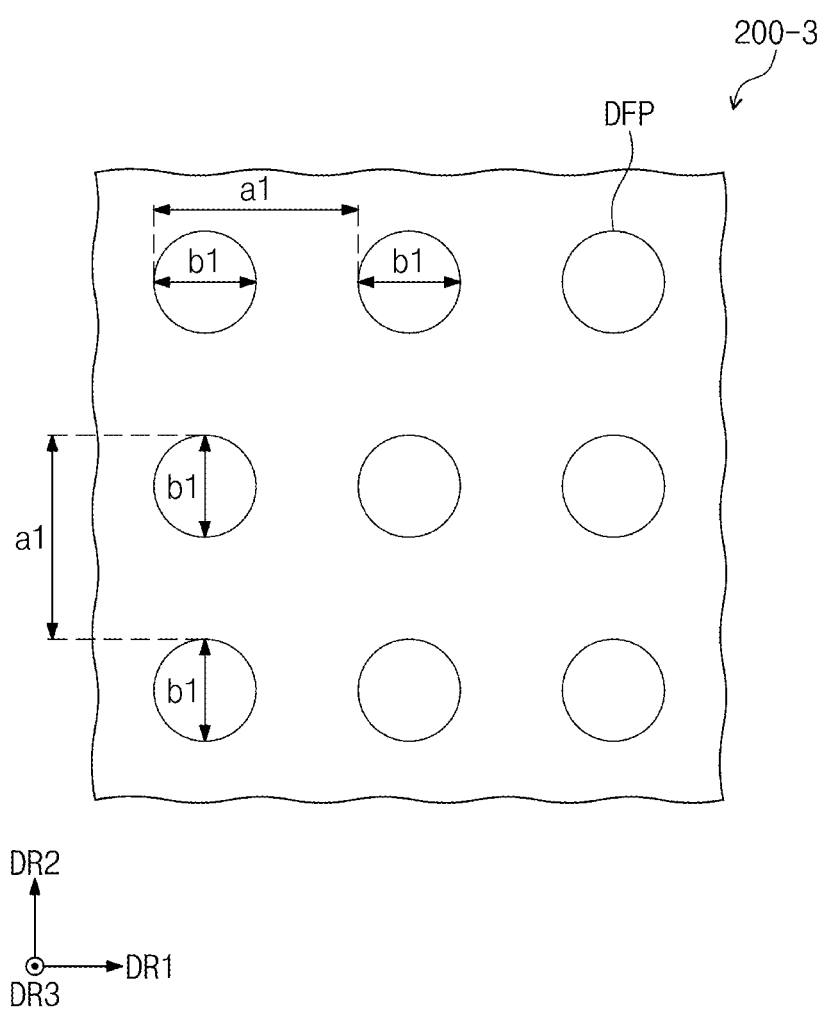
FIG. 10 is a plan view showing a first insulating layer according to an embodiment of the inventive concepts.
Figure 11:
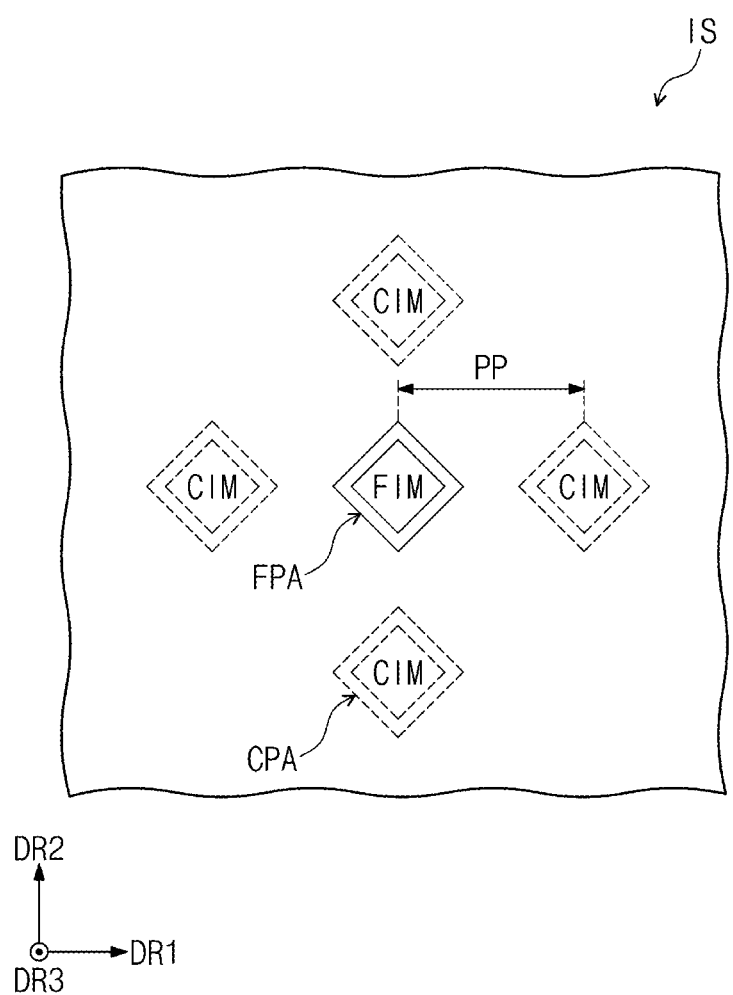
FIG. 11 is a plan view showing a front pixel image and copy pixel images displayed on a display surface by a diffraction grating.

Referring to FIGS. 9, 10, and 11, the diffraction grating GR may diffract the light incident thereto to prevent or reduce occurrence of the color shift. In more detail, the holes DFP that are arranged at regular intervals a1 (hereinafter, referred to as an "arrangement interval") and define the diffraction grating GR may diffract a second light L2 inclined at a specific angle with respect to a first light L1 among the lights incident thereto and may display a copy pixel image CIM through the display surface IS. In the present embodiment, each of the holes DFP may have a uniform width b1, i.e., a diameter. As an example, the width of each of the holes DFP may be about 1 micrometers. The interval of the holes DFP may be smaller than a width of a corresponding light emitting area PXA.

Referring to FIG. 11, the display surface IS according to the embodiment of the present disclosure may include a front pixel area FPA and a plurality of copy pixel areas CPA. The copy pixel areas CPA may be arranged to surround the front pixel area FPA. In the present embodiment, the copy pixel areas CPA may be defined at both sides in the first direction DR1 of the front pixel area FPA and both sides in the second direction DR2 of the front pixel area FPA. The front pixel area FPA may have substantially the same shape as the copy pixel areas CPA.

The front pixel area FPA may be arranged to be spaced apart from the copy pixel areas CPA. An interval between the front pixel area FPA and the copy pixel areas CPA may be referred to as a "copy interval PP". The copy interval PP is a distance between a center portion of the front pixel area FPA and a center portion of each of the copy pixel areas CPA.

The copy interval PP may vary depending on a distance z1 between the diffraction grating GR and the light emitting device 114, a refractive index of a second insulating layer 200-5, and the arrangement interval a1 of the holes DFP. For example, the copy interval PP may increase by increasing the distance z1 between the holes DFP and the light emitting device 114 or by decreasing the arrangement interval a1 of the holes DFP. As described above, a desired copy interval PP may be secured by adjusting the value of the above-mentioned variables.

According to the present embodiment, the first light L1 of the light generated by the light emitting device 114 may be displayed in the front pixel area FPA of the display surface IS as a front pixel image FIM after passing through intermediate members. The shape of the front pixel image FIM may correspond to the shape of the light emitting device 114 when viewed in the plane. In addition, the second light L2 of the light generated by the light emitting device 114 may be displayed in the copy pixel areas CPA of the display surface IS as the copy pixel image CIM after passing through the intermediate members. The shape of the copy pixel image CIM may be displayed in the same shape as the front pixel image FIM by copying the front pixel image FIM. Accordingly, the image 1000-I (shown in FIG. 1) displayed by the display device 1000 may be provided to the user in a form in which front pixel images FIM and the copy pixel images CIM are mixed. When compared with a screen through which only the front pixel images FIM are provided, the screen through which the front pixel images FIM and the copy pixel images CIM are provided in the mixed form may deliver the same image quality and color to the user even though the viewing angle of the user is changed.

According to the embodiment of the present disclosure, the front pixel image FIM and the copy pixel images CIM may be displayed through the display surface IS using the light generated by one light emitting device 114. Therefore, even though the user sees the display surface IS from the lateral side, the user may view the copy pixel images CIM, and thus, the side viewing angle of the display device 1000 may be improved.

Figure 12A:
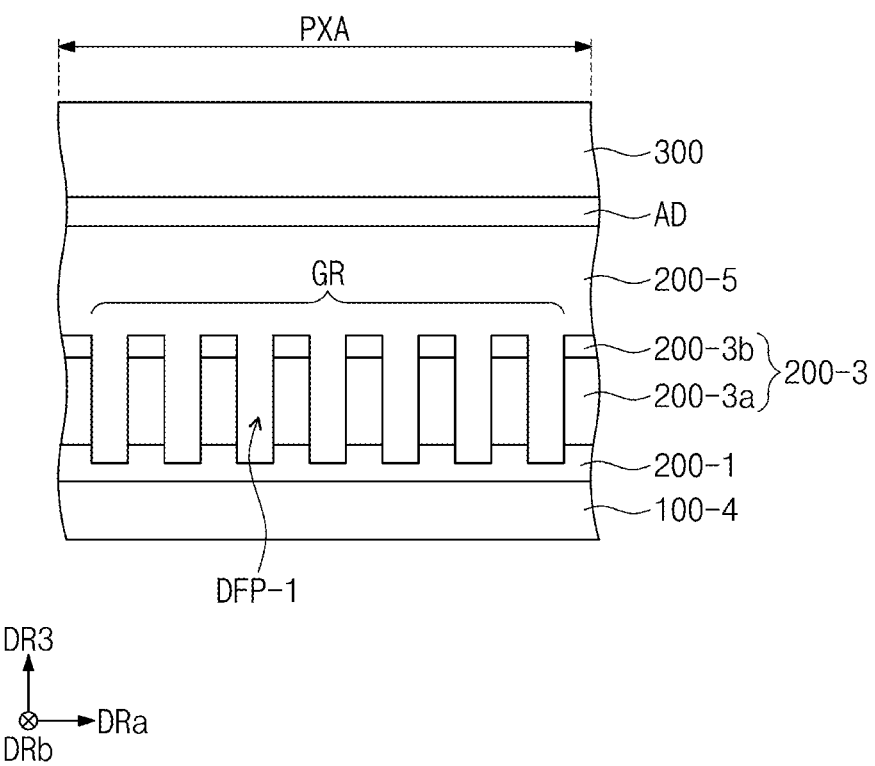
FIGS. 12A and 12B are cross-sectional views showing a display device according to an embodiment of the inventive concepts.
Figure 12B:
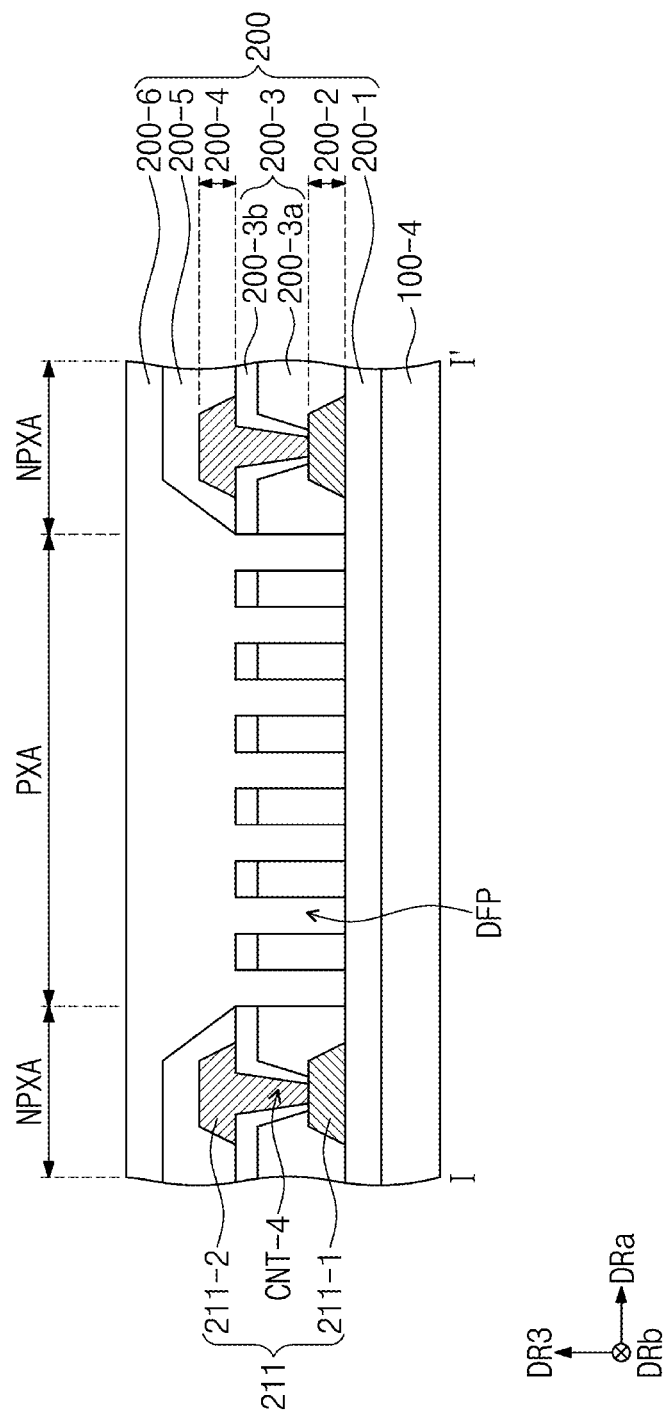

FIGS. 12A and 12B are cross-sectional views showing a display device according to an embodiment of the present disclosure.

In FIG. 12A, a plurality of holes DFP-1 that defines a diffraction grating GR may have a depth greater than a thickness of a first insulating layer 200-3. The holes DFP-1 may be arranged at regular intervals. At least one of the holes DFP-1 may extend to a portion of a base insulating layer 200-1 after penetrating through an inorganic layer 200-3b and an organic layer 200-3a. The base insulating layer 200-1 may include a groove aligned with a first hole DFP1 and a second hole DFP2. A second insulating layer 200-5 may be filled in the holes DFP-1, and thus, the second insulating layer 200-5 may be filled in the groove of the base insulating layer 200-1.

In FIG. 12B, an input sensor 200 may further include a third insulating layer 200-6. An opening OP that exposes a diffraction grating GR may be defined penetrating through a second insulating layer 200-5. The third insulating layer 200-6 may cover a first insulating layer 200-3 in which the diffraction grating GR is defined and the second insulating layer 200-5. The third insulating layer 200-6 may be filled in a plurality of holes DFP. In an embodiment, a refractive index of the first insulating layer 200-3, a refractive index of the second insulating layer 200-5, and a refractive index of the third insulating layer 200-6 may be different from each other. Thus, as the input sensor 200 further includes the third insulating layer 200-6 having the refractive index different from those of the first and second insulating layers 200-3 and 200-5, more light diffraction may be caused, and the effect of increasing the viewing angle may be improved.

FIGS. 13A, 13B, 13C, 13D, 13E, 13F, 13G, and 13H are views showing a method of manufacturing a display device according to an embodiment of the present disclosure. FIGS. 14A, 14B, 14C, 14D, 14E, 14F, 14G, and 14H are views showing a method of manufacturing a display device according to an embodiment of the present disclosure.

Referring to FIGS. 13A to 13H and 14A to 14H, the manufacturing method of the display device may include forming the display panel 100 in which the light emitting area PXA emitting the light is defined and forming the input sensor 200 on the display panel 100. According to an embodiment, the forming of the input sensor may include forming the first conductive layer 200-2, forming the organic layer 200-3a covering the first conductive layer 200-2 and the inorganic layer 200-3b disposed on the organic layer 200-3a, forming the second conductive layer 200-4 disposed on the first insulating layer 200-3 and connected to the first conductive layer 200-2 through the contact hole CNT-4, forming the holes DFP in the first insulating layer 200-3 to define the diffraction grating GR, and forming the second insulating layer 200-5 that covers the second conductive layer 200-4 and the first insulating layer 200-3.

According to an embodiment, the forming of the display panel 100 may include forming the base layer 100-1, forming the circuit element layer 100-2 on the base layer 100-1, forming the display element layer 100-3 on the circuit element layer 100-2, and forming the encapsulation layer 100-4 on the display element layer 100-3. According to an embodiment, the input sensor 200 may be disposed directly on the encapsulation layer 100-4 of the display panel 100.

In FIGS. 13A to 13H, the forming of the first insulating layer according to the embodiment of the present disclosure may include forming the organic layer through which the first through hole is defined to expose the portion of the first conductive layer, forming the inorganic layer on the organic layer to cover an inner wall of the first through hole, forming a photoresist layer on the inorganic layer, forming a first photoresist pattern layer that includes a base portion through which an opening is defined and a protrusion portion protruded from the base portion from the photoresist layer using a mask, forming the second through hole penetrating through the inorganic layer, and forming a second photoresist pattern layer having patterns corresponding to the protrusion portion from the first photoresist pattern layer.

Figure 13A:
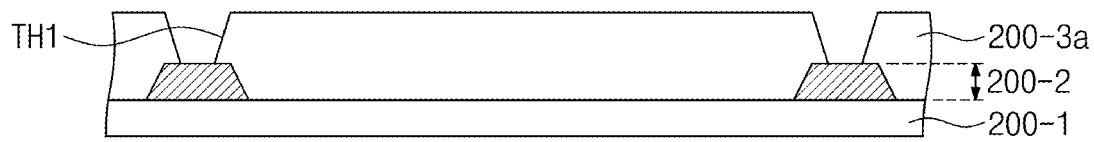
FIGS. 13A, 13B, 13C, 13D, 13E, 13F, 13G, and 13H are views showing a method of manufacturing a display device according to an embodiment of the inventive concepts.

In FIG. 13A, the first conductive layer 200-2 may be formed on the base insulating layer 200-1. The base insulating layer 200-1 may be formed directly on the encapsulation layer 100-4. The organic layer 200-3a may be patterned on the first conductive layer 200-2. The organic layer 200-3a may be provided with the first through hole TH1 to expose the portion of the first conductive layer 200-2. The organic layer may include a photosensitive material.

Figure 13B:
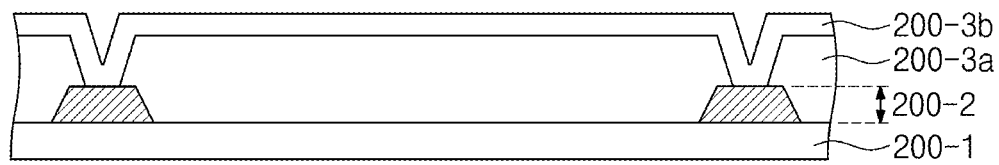

In FIG. 13B, the inorganic layer 200-3b may be coated on the organic layer 200-3a.

Figure 13C:
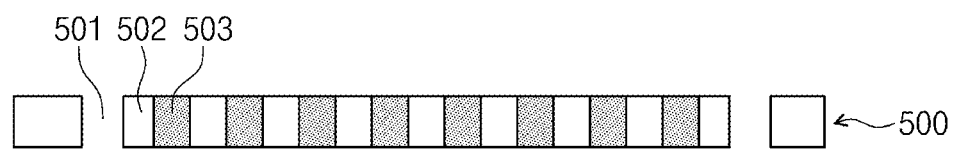
Figure 13C:
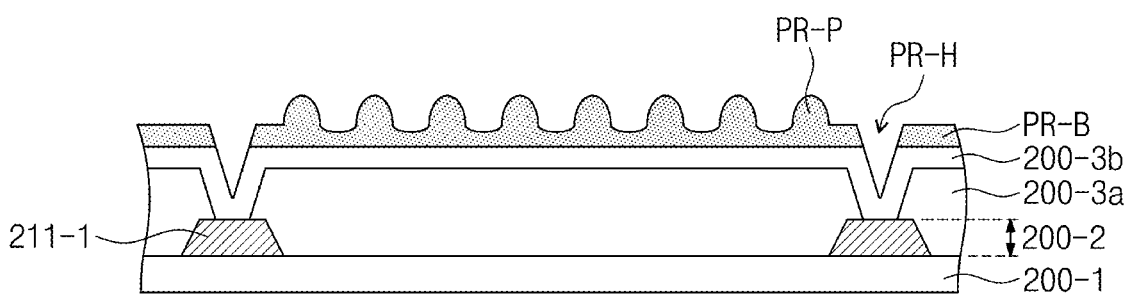

In FIG. 13C, the photoresist layer (not shown) may be formed on the inorganic layer 200-3b. The photoresist layer may include a positive photoresist material or a negative photoresist material. According to an embodiment, the first photoresist pattern layer PR may be formed from the photoresist layer. The first photoresist pattern layer PR may be formed by disposing a mask 500 on the photoresist layer and patterning the photoresist layer using the mask 500. In the present embodiment, the mask 500 may be a half-tone mask including a transmission area 501, a semi-transmission area 502, and a blocking area 503. The first photoresist pattern layer PR may include the base portion PR-B through which the opening PR-H is defined, and the protrusion portion PR-P protruded from the base portion PR-B.

Figure 13D:
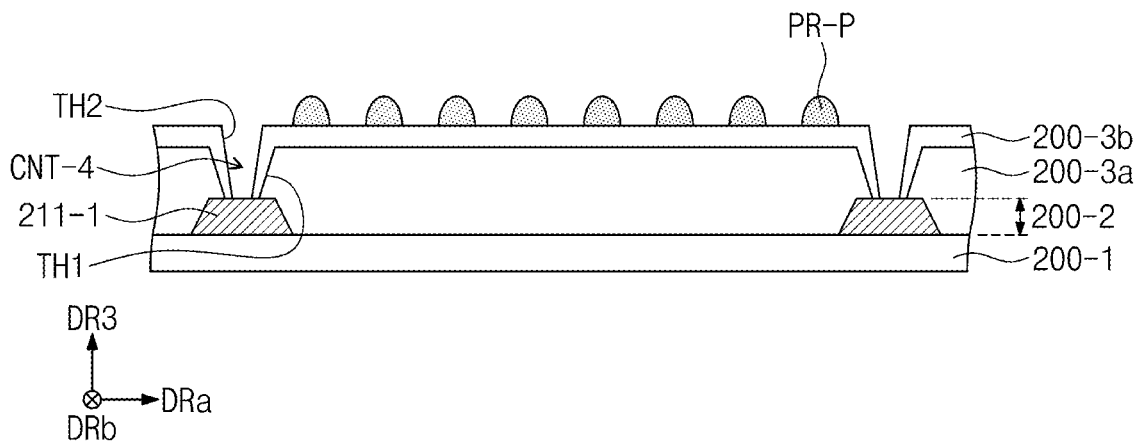

In FIG. 13D, the portion of the inorganic layer 200-3b may be etched through the opening PR-H of the first photoresist pattern layer PR, and the contact hole CNT-4 through which the portion of the first conductive layer 200-2 is exposed may be formed. Simultaneously, the base portion PR-B of the first photoresist pattern layer PR may be removed through an ashing process, so that the second photoresist pattern layer PR-P may be formed. The second photoresist pattern layer PR-P may include only the protrusion portion PR-P of the first photoresist pattern layer PR. The second photoresist pattern layer PR-P may serve as a mask in an etching process used to form the diffraction grating GR. Herein, the second photoresist pattern layer and the protrusion portion may utilize the same referential numeral "PR-P".

Figure 13E:
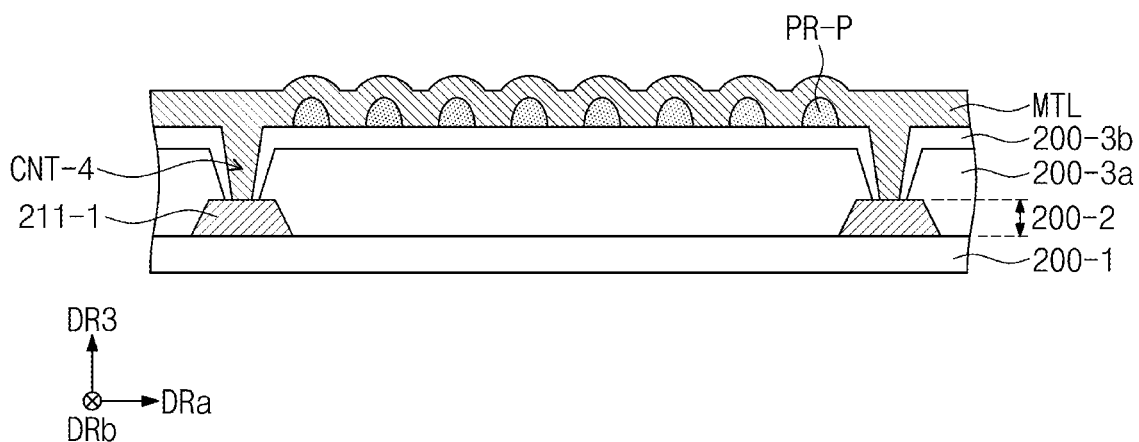
Figure 13F:
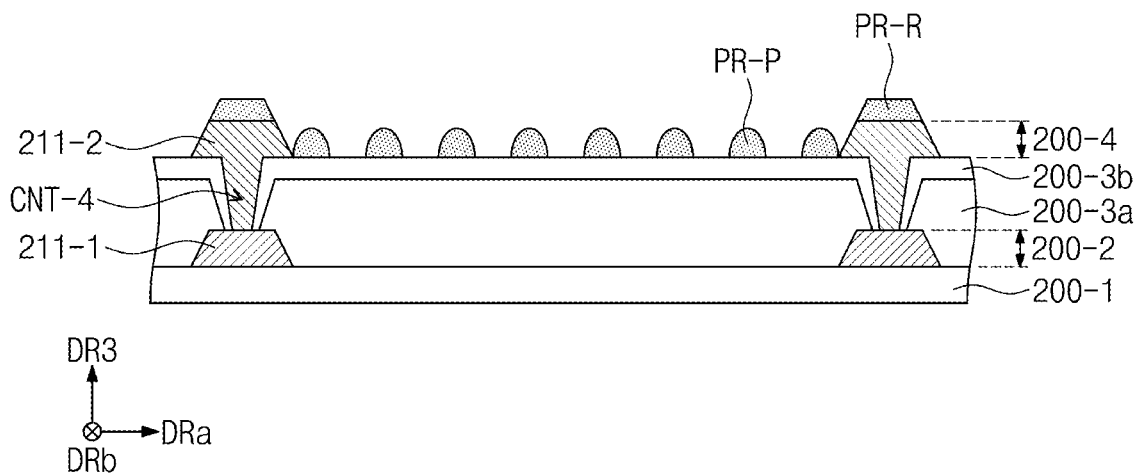

In FIG. 13E, a metal layer MTL may be preliminary formed on the first insulating layer 200-3 to form the second conductive layer 200-4. In FIG. 13F, the second conductive layer 200-4 may be patterned on the first insulating layer 200-3 through an exposure process and a development process.

Figure 13G:
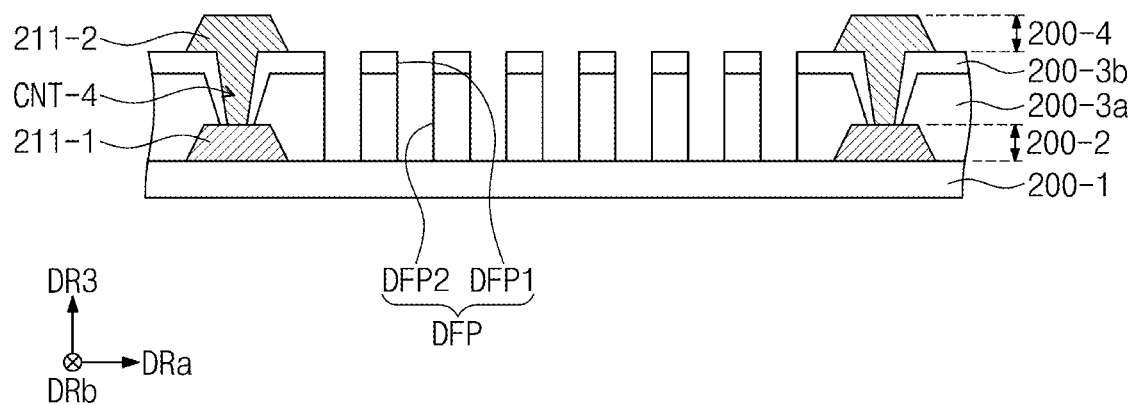

In FIG. 13G, the diffraction grating GR may be formed on the first insulating layer 200-3. According to an embodiment, the forming of the holes DFP may include patterning the inorganic layer 200-3b and the organic layer 200-3a using the second photoresist pattern layer PR-P. The patterning of the inorganic layer 200-3b and the organic layer 200-3a may include etching the inorganic layer 200-3b in an area that is not covered by the second photoresist pattern layer PR-P in the first insulating layer 200-3 to expose the portion of the organic layer 200-3a, performing an ashing process to remove the second photoresist pattern layer PR-P, and performing an etching process on the exposed portion of the organic layer corresponding to the etched area of the inorganic layer 200-3b using the inorganic layer 200-3b as a hard mask.

Figure 13H:
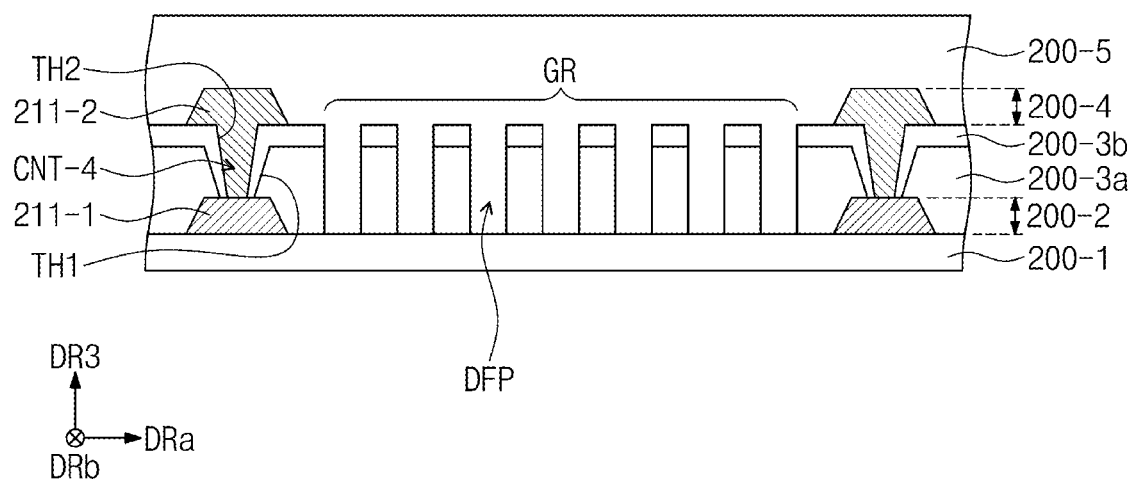

In FIG. 13H, the second insulating layer 200-5 may be coated to cover the second conductive layer 200-4 and the first insulating layer 200-3 and may be filled in the holes DFP. The second insulating layer 200-5 may include a material having a refractive index different from that of the first insulating layer 200-3.

In FIGS. 14A to 14H, the forming of the first insulating layer according to the embodiment of the present disclosure may include forming the organic layer that covers the first conductive layer, forming the inorganic layer on the organic layer, forming a photoresist layer on the inorganic layer, forming a first photoresist pattern layer that includes a base portion through which an opening is defined and a protrusion portion protruded from the base portion from the photoresist layer using a mask, forming the contact hole through the inorganic layer and the organic layer to expose the portion of the first conductive layer, and forming a second photoresist pattern layer that includes patterns corresponding to the protrusion portion from the first photoresist pattern layer.

Figure 14A:
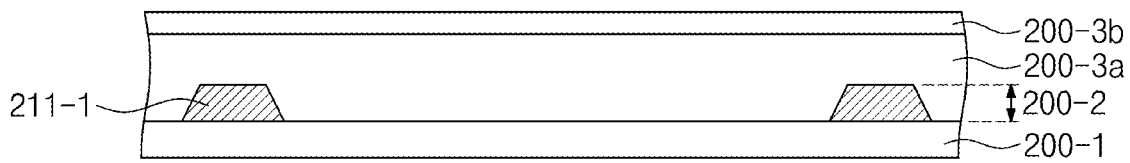
FIGS. 14A. 14B, 14C, 14D, 14E, 14F, 14G, and 14H are views showing a method of manufacturing a display device according to an embodiment of the inventive concepts.

In FIG. 14A, the first conductive layer 200-2 may be patterned on the base insulating layer 200-1, and the first insulating layer 200-3 may be formed to cover the first conductive layer 200-2. The first insulating layer 200-3 may include the organic layer 200-3a and the inorganic layer 200-3b disposed on the organic layer 200-3a. The organic layer 200-3a may include a non-photosensitive material. For example, the non-photosensitive material may include silicon oxide.

Figure 14B:
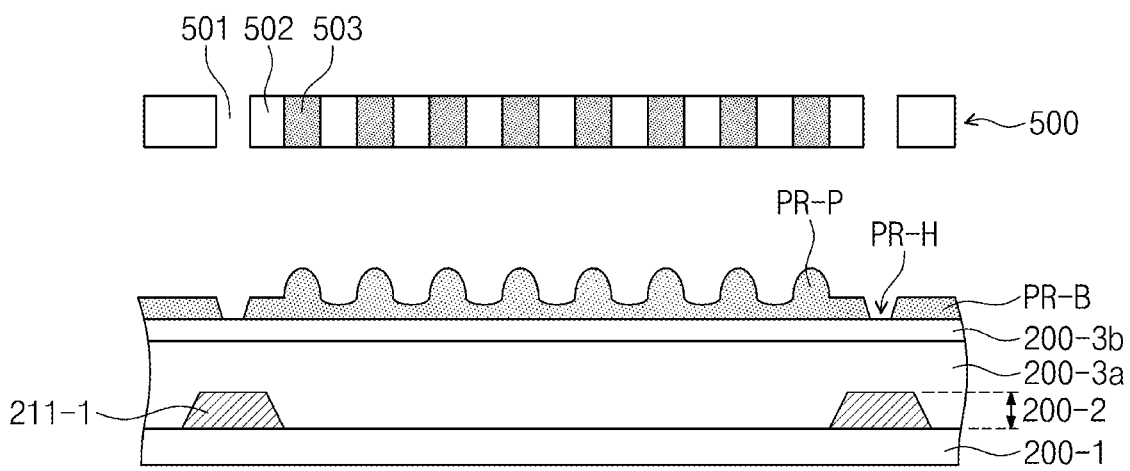

In FIG. 14B, the photoresist layer (not shown) may be formed on the inorganic layer, and the first photoresist pattern layer PR that includes a base portion PR-B through which an opening PR-H is defined and a protrusion portion PR-P protruded from the base portion PR-B may be formed from the photoresist layer using the mask 500. The mask 500 may be a half-tone mask.

Figure 14C:
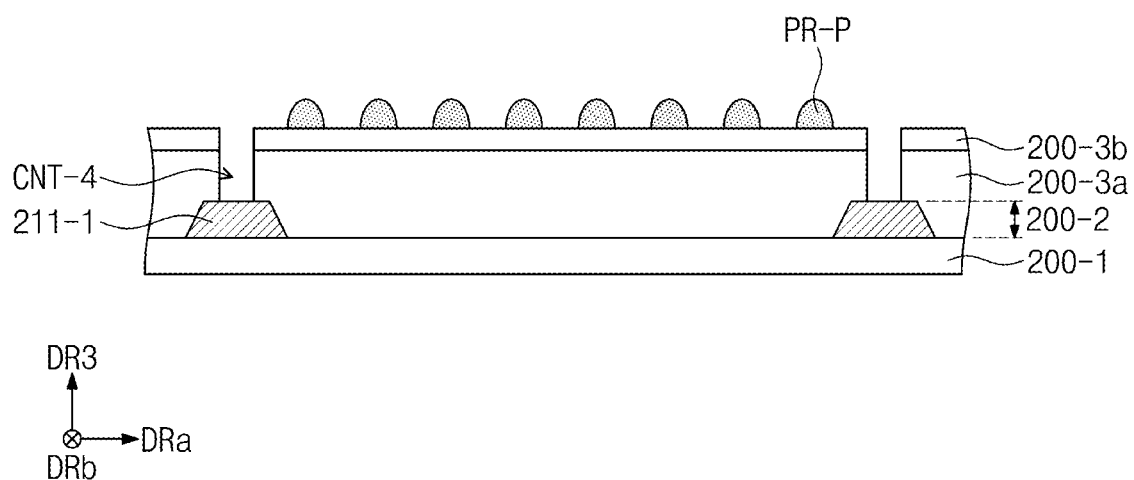

In FIG. 14C, the contact hole CNT-4 may be formed by passing through the opening of the first photoresist pattern layer and penetrating through the first insulating layer 200-3 using an etching process. Portions of the inorganic layer and the organic layer, which are not covered by the first photoresist pattern layer, may be etched to expose the portion of the first conductive layer. Simultaneously, the base portion may be removed from the first photoresist pattern layer, so that the second photoresist pattern layer PR-P including patterns corresponding to the protrusion portion PR-P may be formed.

Figure 14D:
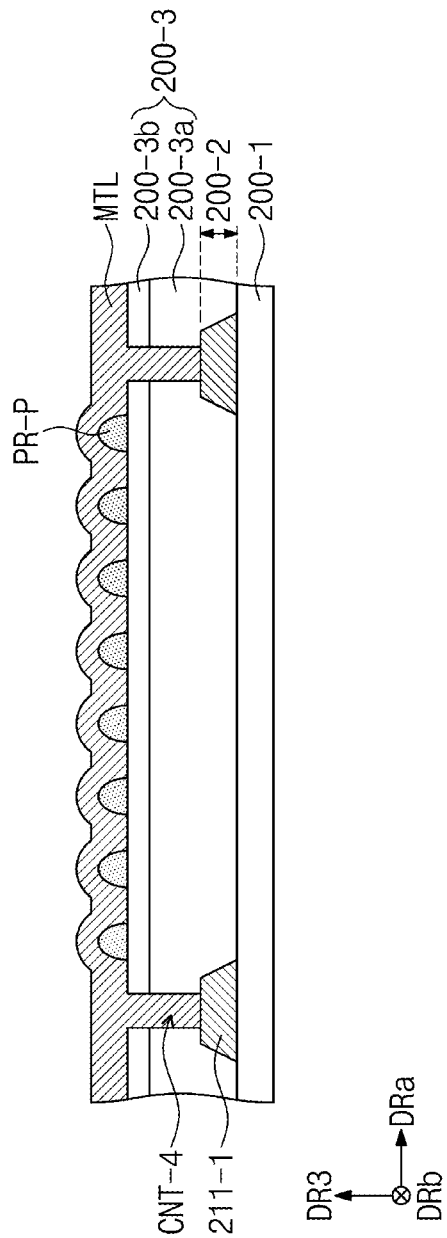
Figure 14E:
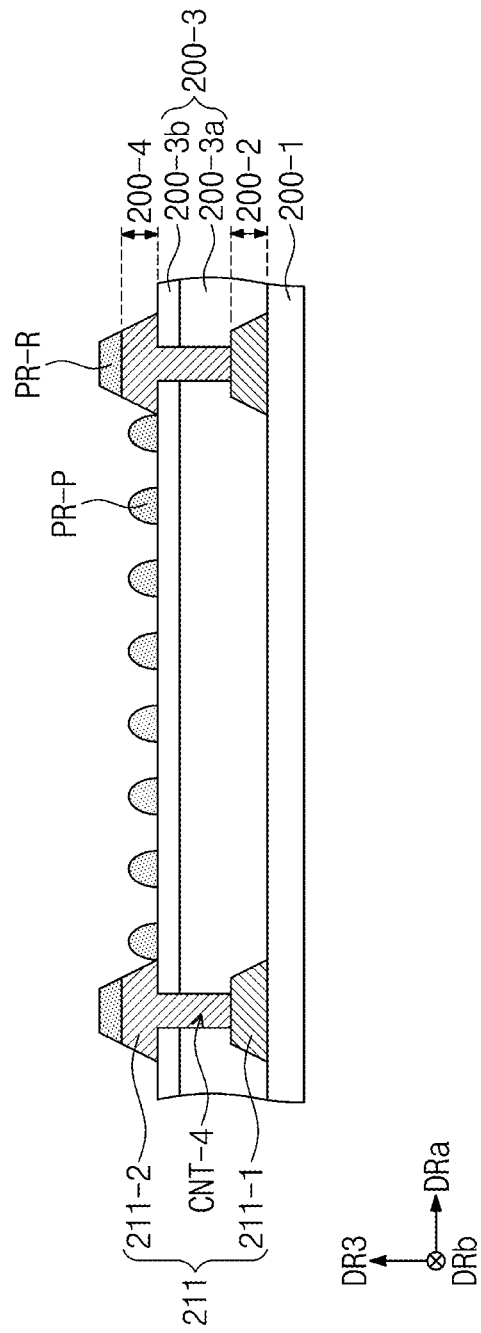

In FIG. 14D, a metal layer MTL may be preliminary formed to form the second conductive layer that is connected to the first conductive layer 200-2 through the contact hole CNT-4. In FIG. 14E, the metal layer MTL may be patterned through an exposure process and a development process, and thus, the second conductive layer 200-4 may be formed.

Figure 14F:
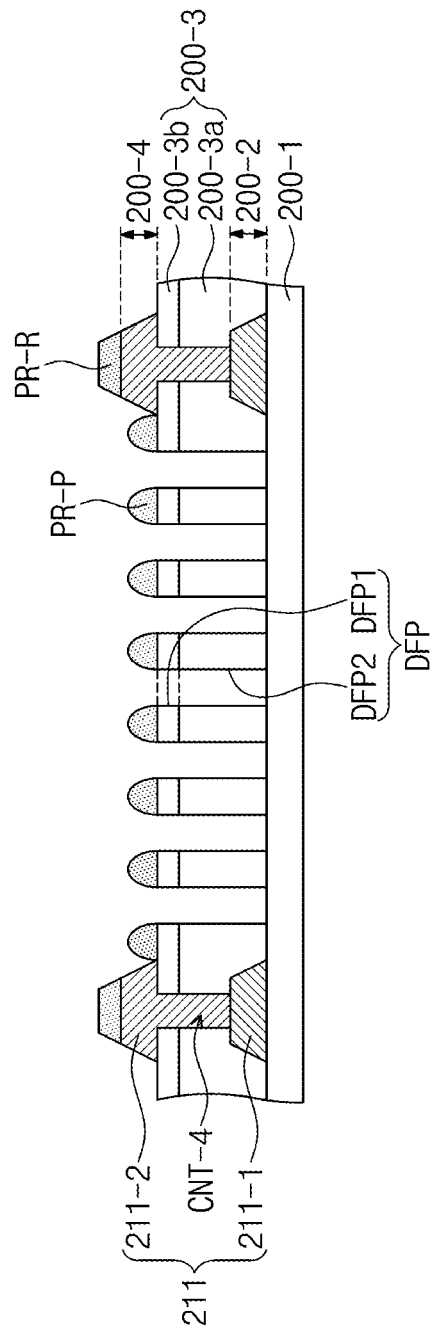
Figure 14G:
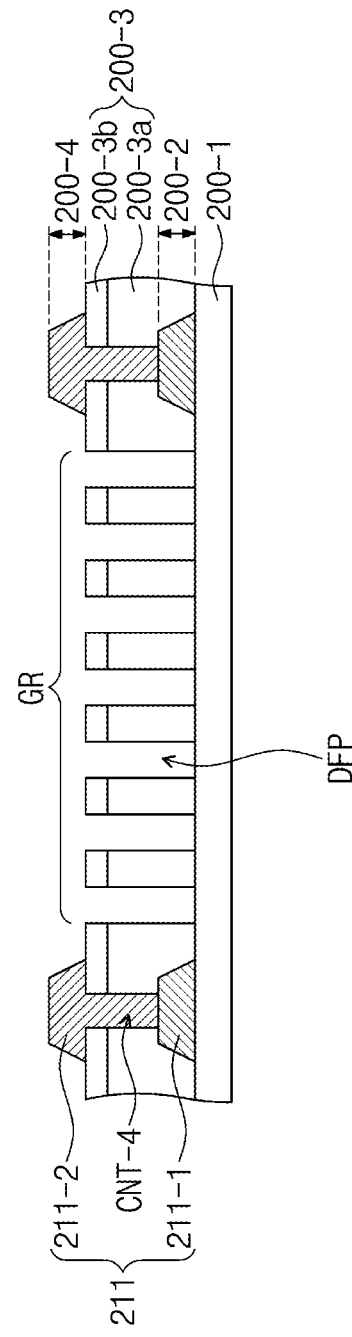
Figure 14H:
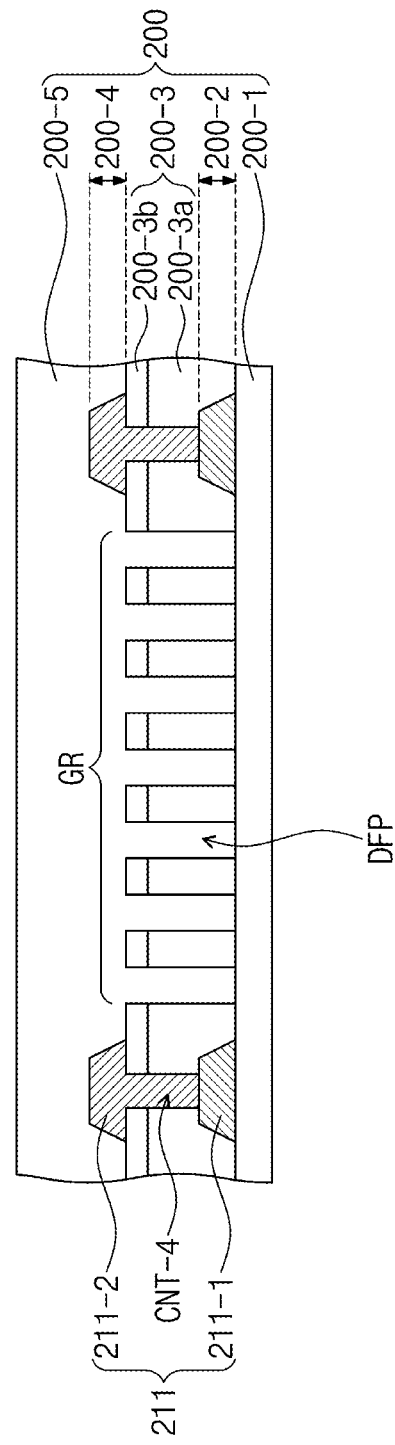

In FIG. 14F, an etching process may be performed on some areas of the first insulating layer 200-3, which are not covered by the second photoresist pattern layer PR-P, to form the holes DFP. Then, in FIG. 14G, the second photoresist pattern layer PR-P may be removed. In FIG. 14H, the second insulating layer 200-5 may be coated on the first insulating layer 200-3, and the second insulating layer 200-5 may cover the second conductive layer 200-4 and may be filled in the holes DFP. In this case, the contact hole may be substantially simultaneously formed with the diffraction grating GR, and thus, an efficiency of a mask process may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel with a light emitting area from which a light exits is defined; and
   an input sensor disposed on the display panel, the input sensor comprising:
   a first conductive layer;
   a first insulating layer disposed on the first conductive layer and provided with a diffraction grating defined therein to correspond to the light emitting area; and
   a second conductive layer disposed on the first insulating layer and connected to the first conductive layer, the first insulating layer comprising:
   an organic layer covering the first conductive layer; and
   an inorganic layer disposed on the organic layer, wherein the organic layer and the inorganic layer comprise a plurality of holes defined therein to define the diffraction grating,
   wherein the plurality of holes extend entirely through the organic layer and the inorganic layer with respect to a widthwise direction of the first insulating layer.

2. The display device of claim 1, wherein each of the plurality of holes comprises a first hole penetrating through the inorganic layer and a second hole penetrating through the organic layer, and the first hole and the second hole are aligned with each other.

3. The display device of claim 1, wherein each of the plurality of holes has a depth that is substantially the same as a thickness of the first insulating layer.

4. The display device of claim 1, wherein the second conductive layer comprises a sensing pattern through which an opening is defined, and the opening overlaps the diffraction grating when viewed in a plane.

5. The display device of claim 1, wherein the input sensor further comprises a second insulating layer that covers the second conductive layer, and the second insulating layer is filled in the plurality of holes.

6. The display device of claim 5, wherein the second insulating layer has a refractive index different from a refractive index of the first insulating layer.

7. The display device of claim 5, wherein the second insulating layer is provided with an opening defined therethrough to expose the diffraction grating, and the input sensor further comprises a third insulating layer that covers the first and second insulating layers and is filled in the plurality of holes.

8. The display device of claim 7, wherein a refractive index of the first insulating layer, a refractive index of the second insulating layer, and a refractive index of the third insulating layer are different from each other.

9. The display device of claim 1, wherein the input sensor further comprises a base insulating layer, and the first conductive layer makes contact with the base insulating layer.

10. The display device of claim 9, wherein the base insulating layer is an organic layer.

11. The display device of claim 9, wherein the display panel comprises:
    a base layer;
    a circuit element layer disposed on the base layer;
    a display element layer disposed on the circuit element layer; and
    an encapsulation layer disposed on the display element layer, and the base insulating layer is disposed directly on the encapsulation layer.

12. The display device of claim 9, wherein the plurality of holes are arranged at regular intervals, and at least one of the plurality of holes extends to a portion of the base insulating layer after penetrating through the inorganic layer and the organic layer.

13. The display device of claim 1, wherein the inorganic layer has a thickness smaller than a thickness of the organic layer.

14. The display device of claim 1, wherein the organic layer is provided with a first through hole defined therethrough to expose a portion of the first conductive layer, and the inorganic layer extending to the first through hole to cover a portion of the first conductive layer is provided with a second through hole to expose another portion of the first conductive layer.

15. The display device of claim 1, wherein the inorganic layer has a refractive index different from a refractive index of the organic layer.

16. The display device of claim 15, wherein the refractive index of the organic layer is equal to or greater than about 0.7 and equal to or smaller than about 3, and the refractive index of the inorganic layer is equal to or greater than about 0.3 and equal to or smaller than about 1.

17. The display device of claim 1, wherein the organic layer comprises a non-photosensitive material.

18. The display device of claim 1, further comprising a base insulating layer that is disposed under the organic layer, wherein the plurality of holes extend through the organic layer and the inorganic layer to the base insulating layer.

19. A method of manufacturing a display device, comprising:
    forming a display panel in which a light emitting area emitting a light is defined; and
    forming an input sensor disposed on the display panel, the forming of the input sensor comprising:
    forming a first conductive layer;
    forming a first insulating layer comprising an organic layer covering the first conductive layer and an inorganic layer disposed on the organic layer;
    forming a second conductive layer disposed on the first insulating layer and connected to the first conductive layer through a contact hole;
    forming a plurality of holes defining a diffraction grating in the first insulating layer; and forming a second insulating layer covering the second conductive layer and the first insulating layer, wherein the plurality of holes extend entirely through the organic layer and the inorganic layer with respect to a widthwise direction of the first insulating layer.

20. The method of claim 19, wherein the forming of the first insulating layer comprises:

forming the organic layer through which a first through hole is defined to expose a portion of the first conductive layer;

forming the inorganic layer on the organic layer to cover an inner wall of the first through hole;

forming a photoresist layer on the inorganic layer;

forming a first photoresist pattern layer comprising a base portion through which an opening is defined and a protrusion portion protruded from the base portion from the photoresist layer using a mask;

forming a second through hole through the inorganic layer; and forming a second photoresist pattern layer comprising patterns corresponding to the protrusion portion from the first photoresist pattern layer.

21. The method of claim 19, wherein the forming of the first insulating layer comprises:

forming the organic layer to cover the first conductive layer;

forming the inorganic layer on the organic layer;

forming a photoresist layer on the inorganic layer;

forming a first photoresist pattern layer comprising a base portion through which an opening is defined and a protrusion portion protruded from the base portion from the photoresist layer using a mask;

forming a contact hole through the inorganic layer and the organic layer to expose a portion of the first conductive layer; and forming a second photoresist pattern layer comprising patterns corresponding to the protrusion portion from the first photoresist pattern layer.

22. The method of claim 21, wherein the forming of the plurality of holes comprises:

patterning the organic layer and the inorganic layer using the second photoresist pattern layer, and the patterning of the inorganic layer and the organic layer comprises:

etching an area of the inorganic layer, which is not covered by the second photoresist pattern layer, to expose a portion of the organic layer;

removing the second photoresist pattern layer; and etching the exposed portion of the organic layer.

23. The method of claim 19, wherein the input sensor further comprises a base insulating layer that is an organic layer, and the first conductive layer makes contact with the base insulating layer.

24. The method of claim 19, further comprising:

forming a base layer under the organic layer, wherein the plurality of holes are formed to extend through the organic layer and the inorganic layer to the base insulating layer.

\* \* \* \* \*